United States Patent
Li et al.

(10) Patent No.: US 9,780,207 B2
(45) Date of Patent: Oct. 3, 2017

(54) SELF-ALIGNED HIGH VOLTAGE LDMOS

(71) Applicant: GLOBALFOUNDRIES Singapore Pte. Ltd., Singapore (SG)

(72) Inventors: Liming Li, Singapore (SG); Shaoqiang Zhang, Singapore (SG); Purakh Raj Verma, Singapore (SG); Han Xiao, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 14/983,583

(22) Filed: Dec. 30, 2015

(65) Prior Publication Data

US 2017/0194490 A1   Jul. 6, 2017

(51) Int. Cl.
| | | |
|---|---|---|
| *H01L 29/66* | (2006.01) | |
| *H01L 21/336* | (2006.01) | |
| *H01L 29/78* | (2006.01) | |
| *H01L 21/762* | (2006.01) | |
| *H01L 21/768* | (2006.01) | |
| *H01L 29/10* | (2006.01) | |
| *H01L 29/06* | (2006.01) | |
| *H01L 21/308* | (2006.01) | |
| *H01L 21/265* | (2006.01) | |
| *H01L 21/266* | (2006.01) | |

(52) U.S. Cl.
CPC ........ *H01L 29/7824* (2013.01); *H01L 21/266* (2013.01); *H01L 21/26513* (2013.01); *H01L 21/3081* (2013.01); *H01L 21/76283* (2013.01); *H01L 21/76897* (2013.01); *H01L 29/0649* (2013.01); *H01L 29/1095* (2013.01); *H01L 29/66681* (2013.01)

(58) Field of Classification Search
CPC ............ H01L 29/7824; H01L 29/0649; H01L 29/1095; H01L 29/66681; H01L 21/26513; H01L 21/266; H01L 21/3081; H01L 21/76897; H01L 21/76283
USPC .......................... 257/337, E21.409; 438/286
See application file for complete search history.

(56) References Cited

U.S. PATENT DOCUMENTS

| | | | |
|---|---|---|---|
| 6,963,113 B2 | 11/2005 | Ang et al. | |
| 8,946,819 B2 | 2/2015 | Zhang et al. | |
| 2006/0001084 A1* | 1/2006 | Kelly | H01L 29/407 257/329 |
| 2006/0124999 A1* | 6/2006 | Pendharkar | H01L 29/0878 257/335 |

(Continued)

*Primary Examiner* — Dzung Tran
(74) *Attorney, Agent, or Firm* — Horizon IP Pte. Ltd.

(57) ABSTRACT

Devices and methods for forming a device are disclosed. The method includes providing a crystalline-on-insulator substrate having a bulk substrate and a surface substrate separated by a buried insulator layer. The surface substrate is defined with a device region. A transistor having a gate is formed in the device region. A first diffusion region is formed adjacent to a first side of the gate and a second diffusion region is formed adjacent to and displaced away from a second side of the gate. At least a first drift isolation region is formed in the surface substrate adjacent to and underlaps the second side of the gate. A drift well is formed in the surface substrate encompassing the first drift isolation region. A device isolation region surrounding the device region is formed in the surface substrate. The device isolation region includes a second depth which is deeper than a first depth of the first drift isolation region.

20 Claims, 28 Drawing Sheets

(56) References Cited

U.S. PATENT DOCUMENTS

| | | | |
|---|---|---|---|
| 2012/0094457 A1 | 4/2012 | Gabrys | |
| 2013/0341717 A1* | 12/2013 | Chen | H01L 29/66659 257/337 |
| 2014/0070315 A1* | 3/2014 | Levy | H01L 29/0634 257/343 |
| 2014/0320174 A1* | 10/2014 | Lu | H01L 29/7816 327/109 |
| 2015/0179792 A1* | 6/2015 | Sridhar | H01L 29/0653 257/336 |
| 2015/0270333 A1* | 9/2015 | Yang | H01L 29/063 257/337 |

* cited by examiner

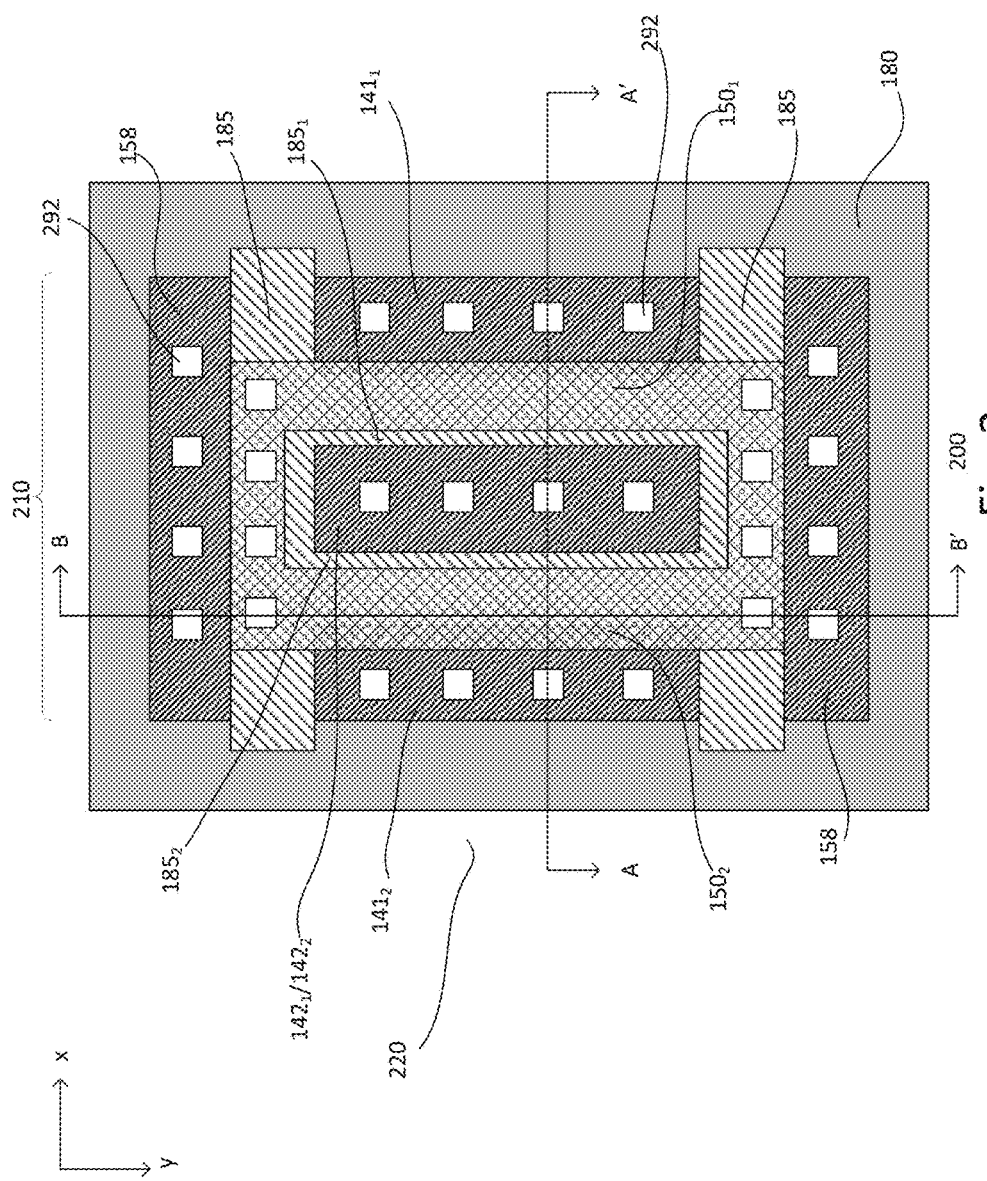

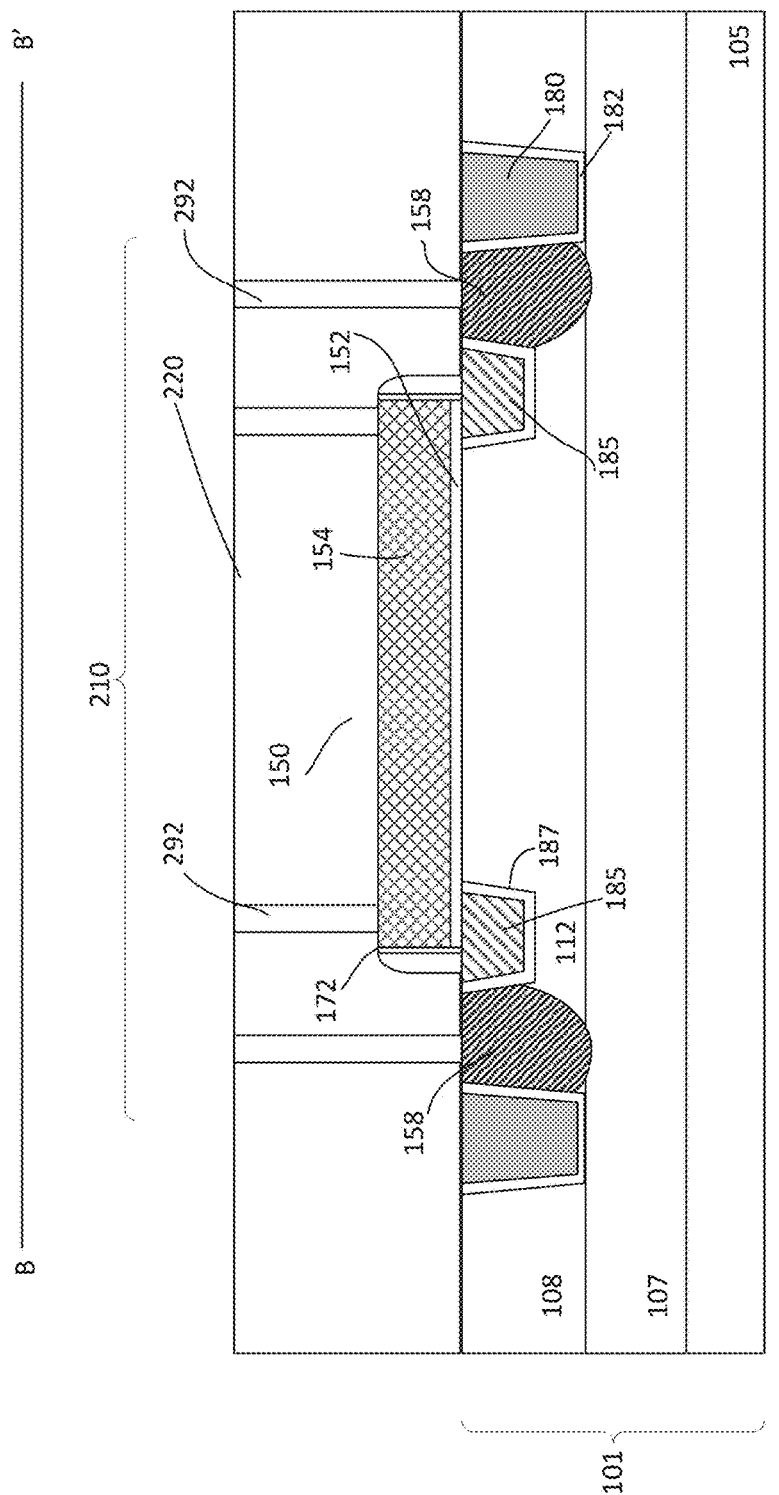

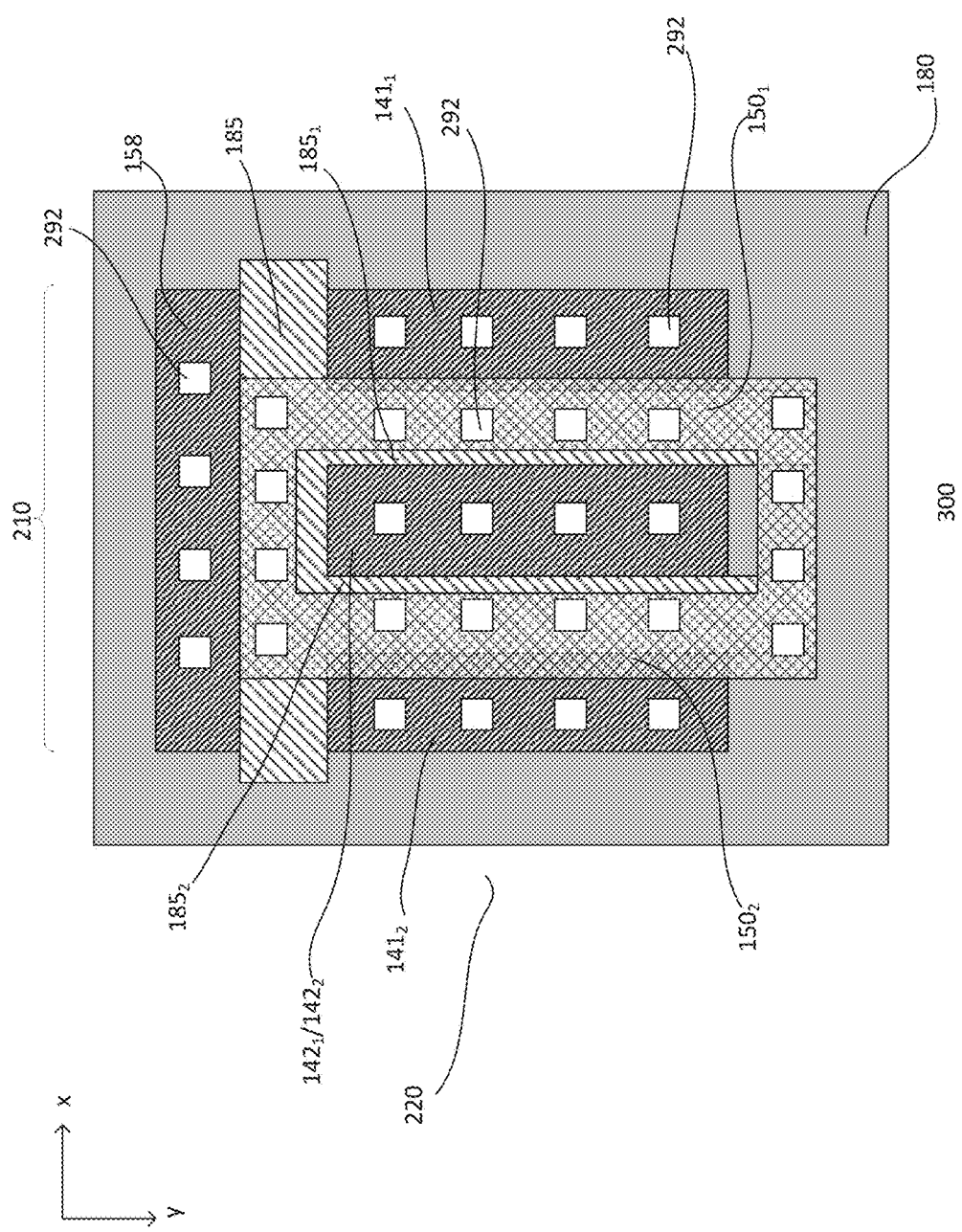

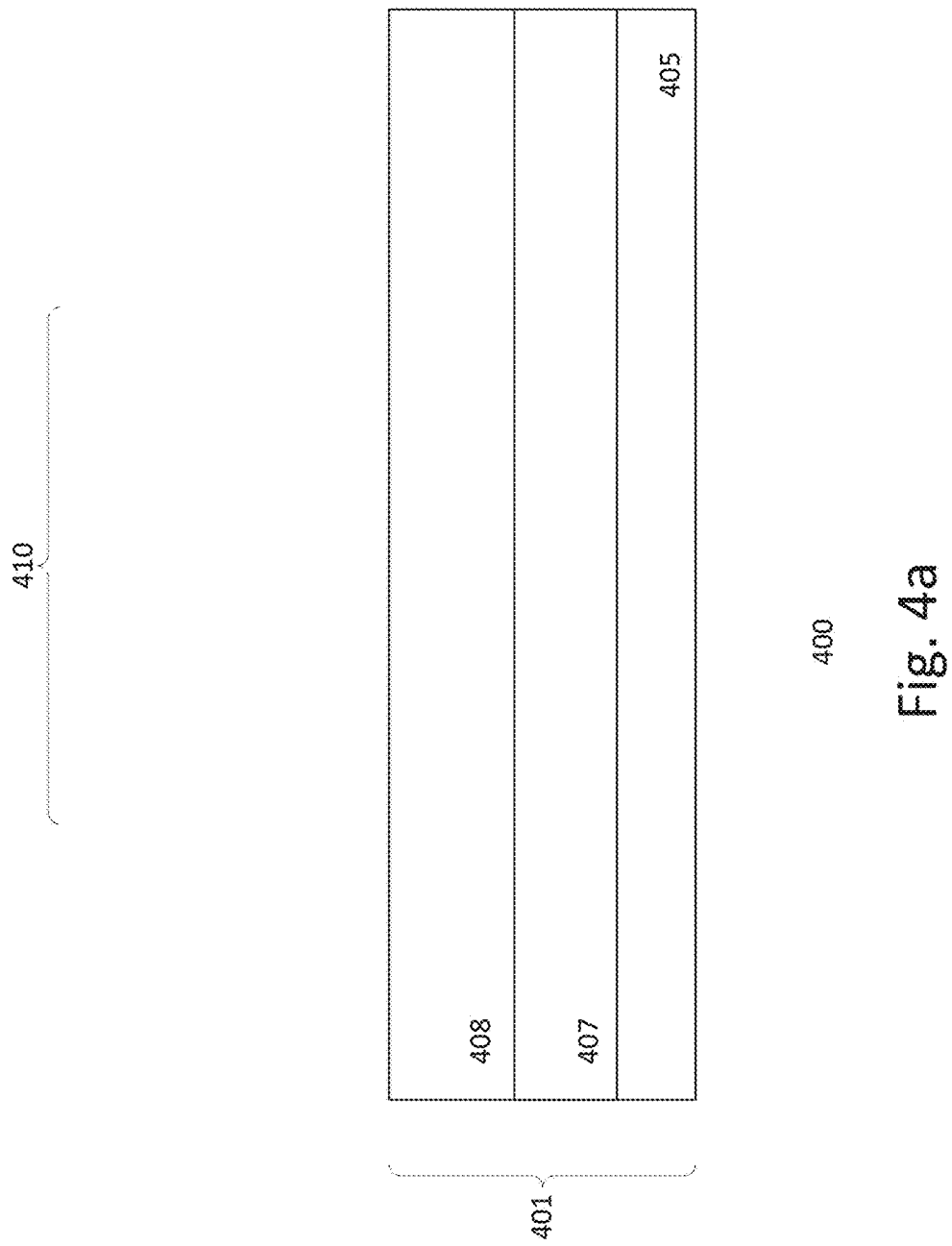

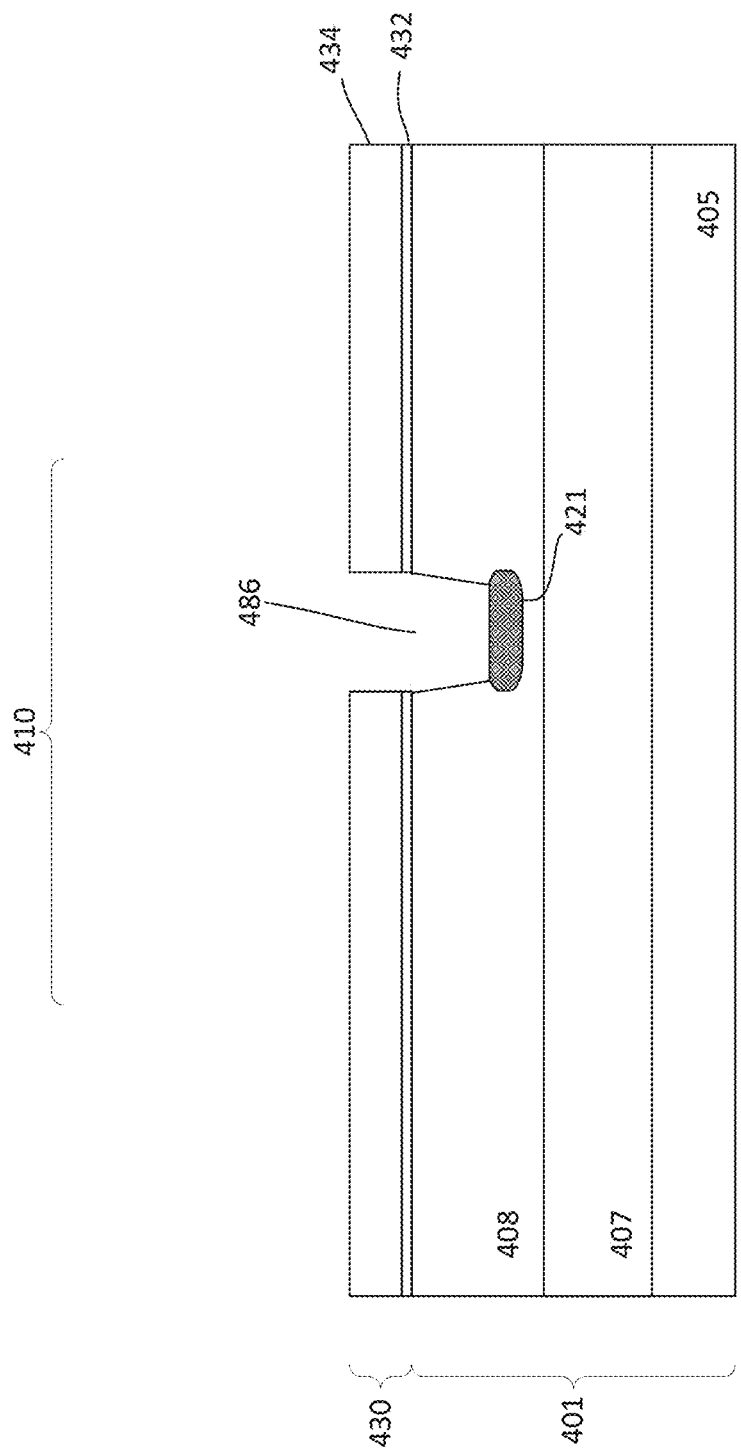

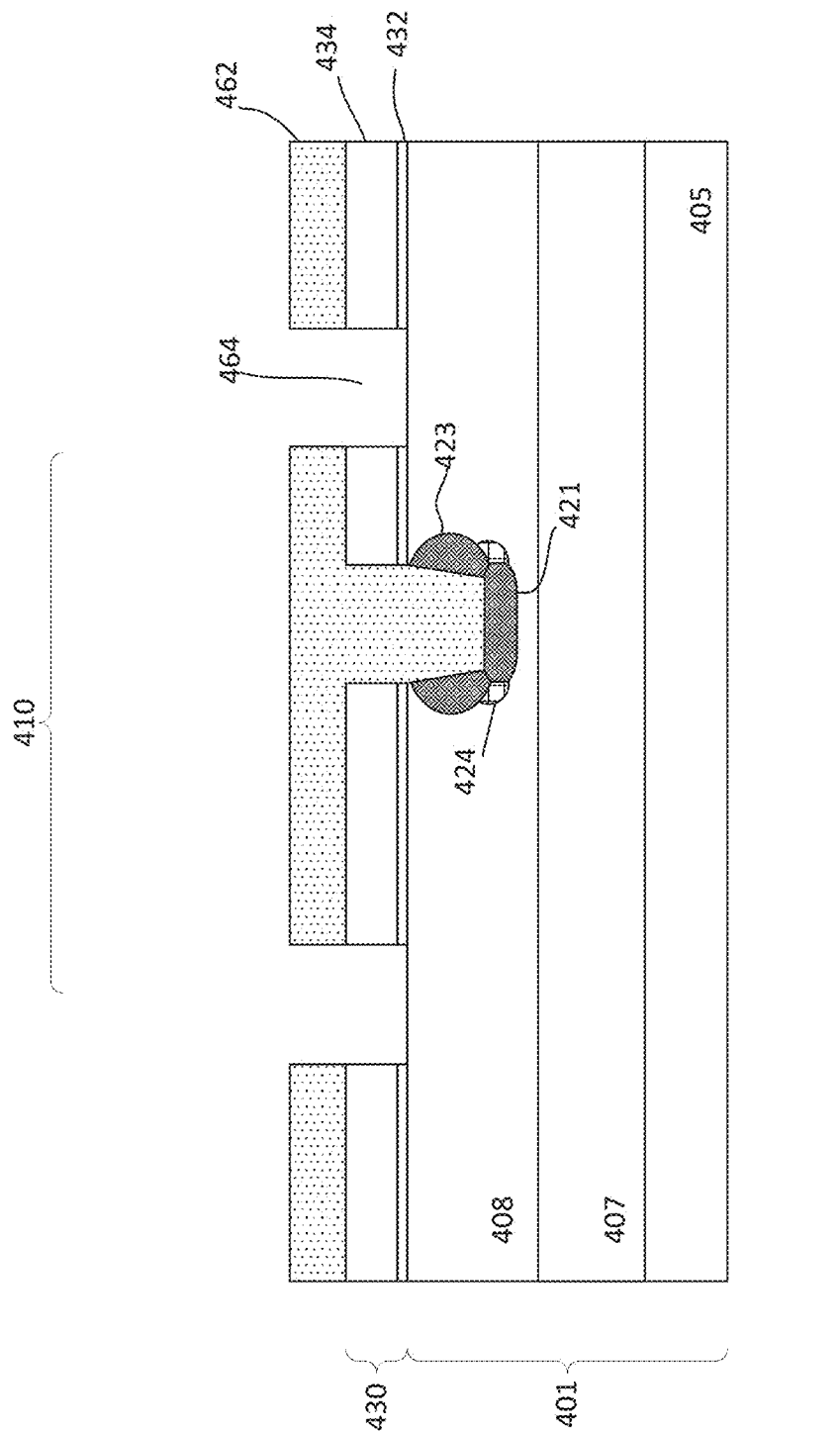

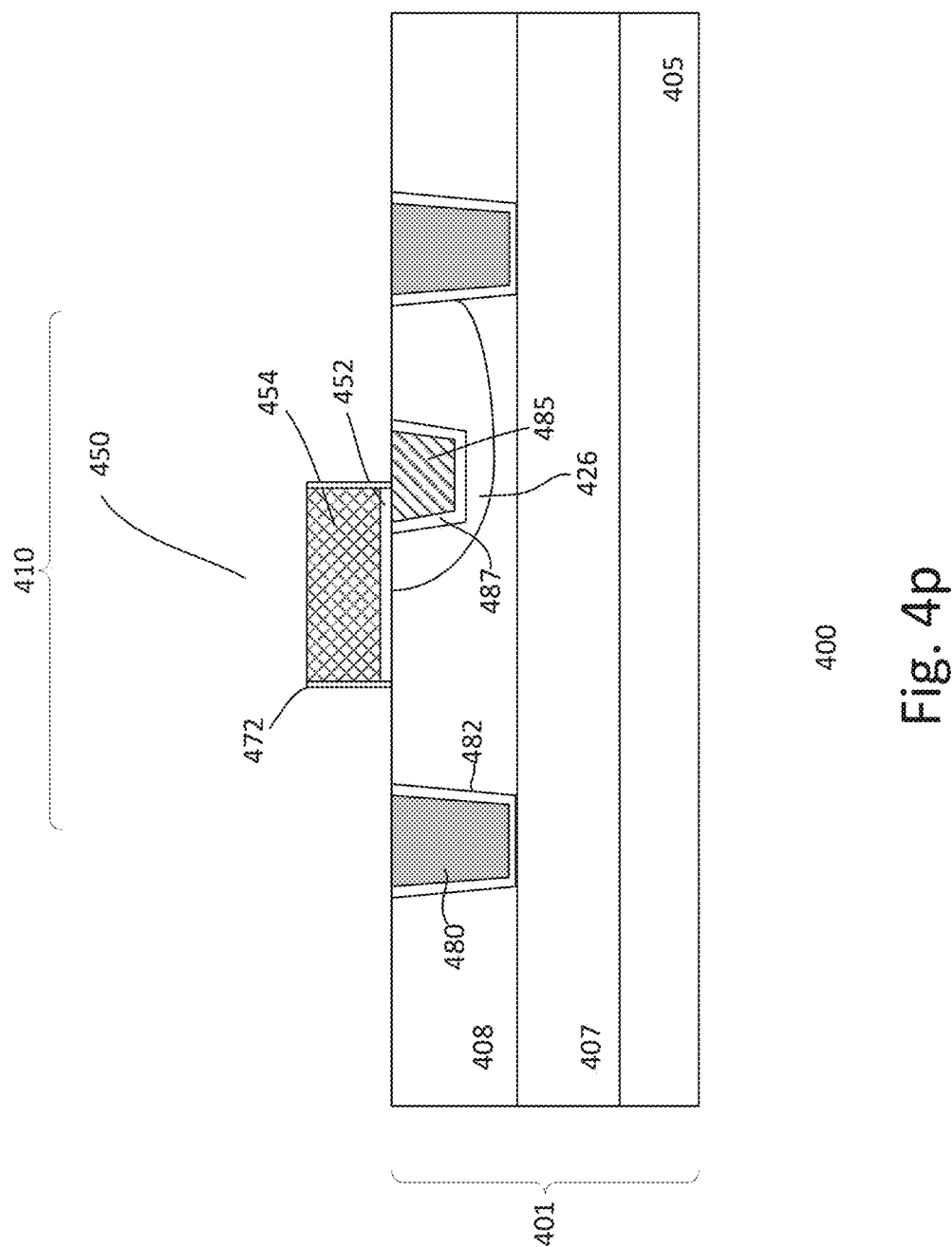

SELF-ALIGNED HIGH VOLTAGE LDMOS

BACKGROUND

Crystalline-on-insulator (COI) substrates, such as silicon-on-insulator (SOI) substrates, are garnering interest since they have lower parasitic capacitance due to isolation from the bulk silicon. This improves power consumption. Additionally, SOI applications are resistant to latchup due to complete isolation of n-wells and p-wells. There are also other advantages in using SOI substrates, which result in overall increased performance.

As indicated, SOI substrates improve power consumption. This is particularly important with high voltage transistors, such as lateral drain-diffused (LD) transistors. For example, LD transistors are widely employed in high voltage applications. The use of COI substrates with LD transistors would result in lower power consumption.

However, conventional LD transistors formed on bulk substrates are not compatible with SOI substrates. For example, conventional LD transistors result in drift regions being disconnected from the channel, rendering it inoperable.

From the foregoing discussion, it is desirable to provide LD transistors which are compatible with CMOS applications using SOI substrates. It is also desirable to provide high voltage transistors with improved RF/Analog performance.

SUMMARY

Embodiments generally relate to semiconductor devices and methods for forming a device. In one embodiment, a method of forming a device is disclosed. The method includes providing a crystalline-on-insulator substrate having a bulk substrate and a surface substrate separated by a buried insulator layer. The surface substrate is defined with a device region. A hard mask layer is formed on the surface substrate and is patterned to form at least a first hard mask opening. At least a first drift isolation trench is formed in the surface substrate using the patterned hard mask with the first hard mask opening. The first drift isolation trench traverses along a channel width direction and includes a first depth which extends partially through the surface substrate. A drift well having first polarity type dopants encompassing the first drift isolation trench is formed. The same hard mask layer is patterned to form a second hard mask opening. A device isolation trench surrounding the device region is formed in the surface substrate using the patterned hard mask with the second hard mask opening. The device isolation trench includes a second depth which extends to a bottom of the surface substrate. The drift and device isolation trenches are filled with isolation material to form a first drift isolation region and device isolation region. A transistor of a first polarity type having a gate is formed in the device region. A first diffusion region is formed adjacent to a first side of the gate and a second diffusion region is formed adjacent to and displaced away from a second side of the gate.

In another embodiment, a method of forming a device is disclosed. The method includes providing a crystalline-on-insulator substrate having a bulk substrate and a surface substrate separated by a buried insulator layer. The surface substrate is defined with a device region. A transistor of a first polarity type having a gate is formed in the device region. A first diffusion region is formed adjacent to a first side of the gate and a second diffusion region is formed adjacent to and displaced away from a second side of the gate. At least a first drift isolation region which traverses along a channel width direction is formed in the surface substrate adjacent to and underlaps the second side of the gate. A drift well having first polarity type dopants is formed in the surface substrate encompassing the first drift isolation region. A device isolation region surrounding the device region is formed in the surface substrate. The device isolation region includes a second depth which is deeper than a first depth of the first drift isolation region.

In yet another embodiment, a device is presented. The device includes a crystalline-on-insulator substrate having a bulk substrate and a surface substrate separated by a buried insulator layer. The surface substrate is defined with a device region. A transistor of a first polarity type having a gate is disposed in the device region. A first diffusion region is disposed adjacent to a first side of the gate and a second diffusion region is disposed adjacent to and displaced away from a second side of the gate. The device includes at least a first drift isolation region which traverses along a channel width direction and disposed in the surface substrate adjacent to and underlaps the second side of the gate. A drift well having first polarity type dopants is disposed in the surface substrate encompassing the first drift isolation region. A device isolation region surrounding the device region is disposed in the surface substrate. The device isolation region includes a second depth which is deeper than a first depth of the first drift isolation region.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. In the following description, various embodiments of the present invention are described with reference to the following drawings, in which:

FIGS. 2a-2c show various views of an embodiment of a LDMOS device in a dual-finger implementation.

FIGS. 3a-3c show various views of another embodiment of a LDMOS device in a dual-finger implementation.

FIG. 3d shows a top view of another embodiment of a LDMOS device in a dual-finger implementation with a single body contact region.

DETAILED DESCRIPTION

Embodiments generally relate to semiconductor devices or integrated circuits (ICs). More particularly, some embodiments relate to high power devices. For example, high voltage or high power devices include lateral drain-diffused (LD) transistors, such as lateral drain-diffused metal oxide semiconductor (LDMOS) transistors. The high power devices can be employed as switching voltage regulators for power management applications. The LD transistors can be easily integrated into devices or ICs. The devices or ICs can be incorporated into or used with, for example, consumer electronic products, and particularly portable consumer products, such as cell phones, laptop computers and personal digital assistants (PDAs). Other types of products may also incorporate the devices.

Figure 1:
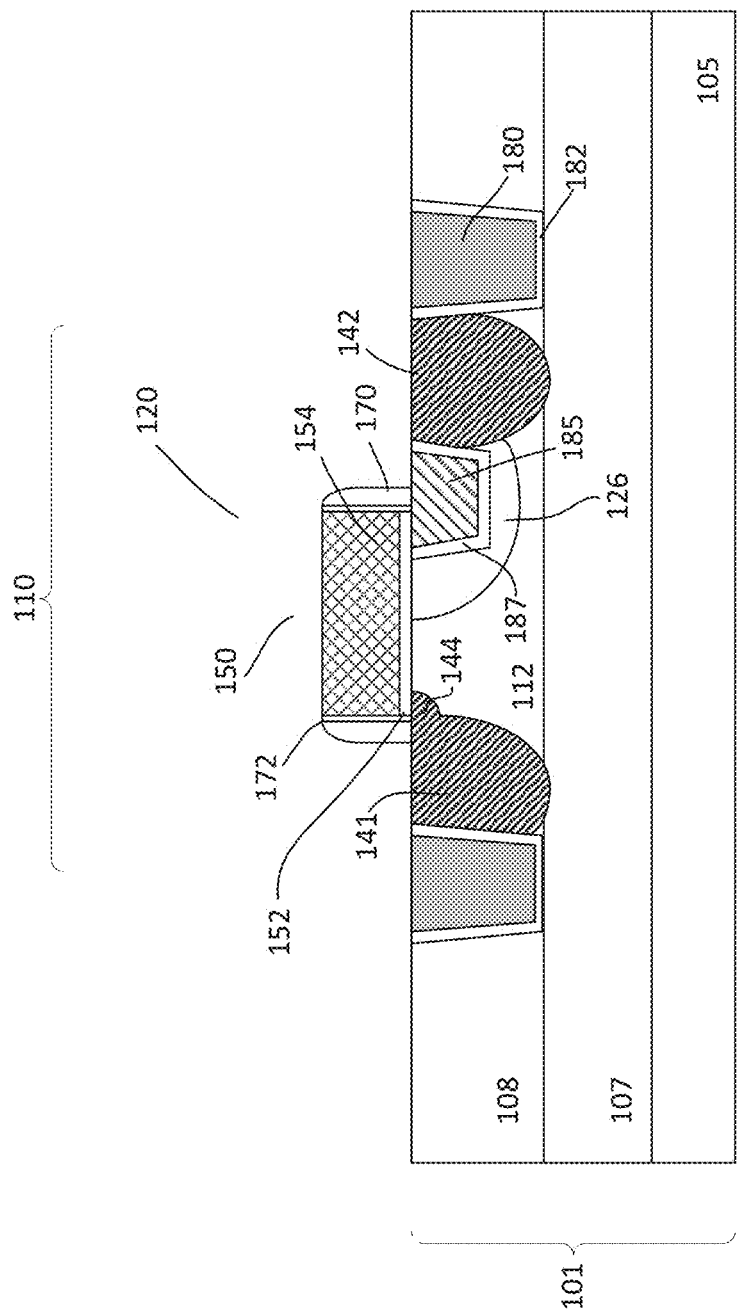
FIG. 1 shows cross-sectional view of an embodiment of a LDMOS device in basic one-finger implementation.

FIG. 1 shows a cross-sectional view of an embodiment of a device 100. The cross-sectional view is along a channel length direction of the device. The device, for example, is an IC. Other types of devices may also be useful. As shown, the device includes a substrate 101. The substrate, in one embodiment, is a crystalline-on-insulator (COI) substrate. A COI substrate includes a support or bulk substrate 105, an insulator layer 107, and top or surface substrate 108. The surface substrate may be a doped substrate. For example, the substrate can be lightly doped with p-type dopants. Doping the substrate with n-type dopants may also be useful.

The device may include doped regions in the surface substrate 108 having different dopant concentrations. For example, the device may include heavily doped ($x^+$), intermediately doped (x) and lightly doped (x) regions, where x is the polarity type which can be p or n. A lightly doped region may have a dopant concentration of about $1E11$-$1E13/cm^2$, an intermediately doped region may have a dopant concentration of about $1E13$-$E15/cm^2$, and a heavily doped region may have a dopant concentration of about $1E15$-$1E17/cm^2$. Providing other dopant concentrations for the different doped regions may also be useful, for example, depending on the breakdown voltage requirement. P-type dopants may include boron (B), aluminum (Al), indium (In) or a combination thereof, while n-type dopants may include phosphorous (P), arsenic (As), antimony (Sb) or a combination thereof.

In one embodiment, the substrate is a silicon-on-insulator (SOI) substrate. The SOI substrate includes a silicon bulk substrate, and a silicon surface substrate separated by an insulator layer. Other types of COI substrates may also be useful. It is understood that the surface and bulk substrates need not be formed of the same material. The insulator layer may be a silicon oxide insulator layer. The insulator layer, for example, may be referred to as a buried insulator layer, such as a buried oxide (BOX) layer. Other suitable types of dielectric insulating materials may also be useful. The thickness of the insulator layer 107 may be about 0.1-1 µm. As for the top surface substrate or layer 108, it may be about 0.05-0.2 µm thick. Other suitable thicknesses for the insulator layer and surface substrate may also be useful.

As shown, the device includes a device region 110 defined on the substrate 101. The device region 110, for example, is disposed in the surface substrate 108. The device region serves as a device region for a LD transistor 120. The substrate may also include regions for other types of transistors, depending on the type of device or IC. For example, the device may also include regions for both n-type and p-type transistors to form a complementary MOS (CMOS) device. The transistors may also include different voltage transistors, such high voltage (HV), intermediate voltage (IV) and low voltage (LV) devices as well as other types of devices, such as memory devices. Other configurations of device regions for the device may also be useful.

The device region is isolated from other device regions by a device isolation region 180. For example, the device isolation region 180 surrounds the device region 110. In one embodiment, the device isolation region is a shallow trench isolation (STI) region. Other types of isolation regions may also be employed. The STI region may include a trench filled with a dielectric material, such as silicon oxide. A dielectric trench liner 182 may be provided to line the trench of the device isolation region. The trench liner, for example, is a silicon oxide liner. Other suitable types of dielectric liners may also be useful. The device isolation region, in one embodiment, extends at least the depth or thickness of the surface substrate. For example, the device region is disposed within the device isolation region.

A device well 112 may be disposed in the device region. The device well, for example, serves as a body for a first polarity type LD transistor. The device well may be a lightly doped device well with second polarity type dopants. For example, the dopant concentration of the device well is about $5E12$-$5E13/cm^2$. The device well may encompass the whole device region within the device isolation region. In some cases, the device well may be part of the doped surface substrate. For example, a second polarity type doped surface substrate may serve as the device well. Other configurations of the device well may also be useful.

The LD transistor includes a gate 150 or a gate finger disposed on the substrate in the device region. A width of the gate, which is along a channel length direction of the transistor, may be about 0.1-50 µm. Other widths may also be useful. The width may depend on, for example, the desired channel length. The gate 150 includes a gate electrode 154 over a gate dielectric 152. The gate dielectric, for example, may be silicon oxide. In one embodiment, the gate dielectric includes a thermal silicon oxide. The gate dielectric, for example, may be a high voltage gate dielectric having a thickness of about 40-500 Å. As for the gate electrode, it may be polysilicon. The gate electrode may be about 700-2000 Å thick. Other types of gate dielectrics and gate electrodes as well as thicknesses may also be useful.

In other embodiments, the gate may be a metal gate. For example, the metal gate includes a high-K gate dielectric and metal gate electrode. The high-K gate dielectric may be a Hf-based high-K dielectric, such as $HfO_2$, HfON, Hf—Si—$O_2$ or Hf—SiON, an Al-based high-K or a Zr-based high-K or a combination of thereof while the metal gate electrode may be TiN, TaN, TiAlN, TaN/TiN, TaC, TaCN or a combination thereof. Other types or configurations of metal gates may also be useful.

The gate may be a gate conductor. The gate conductor may traverse a plurality of device regions. For example, the gate conductor may serve as a common gate for a row or column of transistors. In other cases, the gate may be an island gate. In such cases, the gate is an individual gate for an individual transistor. The gate or gate finger, for example, may be configured in a basic one-finger implementation. Other configurations of the gate may also be useful.

Dielectric sidewall spacers 170, for example, are disposed on sidewalls of the gate. The sidewall spacers, for example, may be silicon nitride. In one embodiment, a dielectric liner 172 is provided between the spacers and gate sidewalls. The dielectric liner, for example, is silicon oxide. Other types of dielectric materials or combination of materials may be used for the spacers.

The gate is disposed between first and second diffusion or source/drain (S/D) regions 141 and 142. For example, the first S/D region 141 is adjacent to a first side of the gate and the second S/D region 142 is adjacent to a second side of the gate. The first S/D region 141 may be referred to as the source while the second S/D region 142 may be referred to as the drain. The length of the device region, for example, is from the ends of S/D regions abutting the device isolation region 180. The S/D regions are heavily doped regions with first polarity type dopants. The first polarity type may be n-type for a n-type LD transistor (e.g., NLDMOS). Providing heavily doped p-type (p$^+$) S/D regions for a p-type transistor (e.g., PLDMOS) may also be useful. The dopant concentration of the S/D regions may be about 1E14-1E16/cm$^2$. Other dopant concentrations for the doped regions may also be useful. The depth of the doped regions 141 and 142 may be about 0.04-0.2 µm. Providing doped regions having other depths may also be useful. Additionally, it is not necessary that the first and second doped regions have the same depth.

The transistor may include a lightly doped extension region 144. The lightly doped extension region may be referred to as a lightly doped diffusion (LDD) region. In one embodiment, the LDD region is provided in the first S/D region. The LDD region is lightly doped with first polarity type dopants. For example, the LDD region has the same polarity type as the S/D region. The dopant concentration of the LDD region may about 1E12~1E14/cm$^2$. Other dopant concentrations may also be useful. A depth of the LDD region is shallower than the S/D region. For example, the depth of the LDD region may be about 0.02-0.1 µm. Providing other depths for the LDD region may also be useful. The LDD region extends under the first side of the gate. For example, the LDD region may extend about 0.004-0.04 µm under the gate. Extending under the gate by other distances may also be useful.

An internal isolation region 185 is provided within the device region 110. The internal isolation region 185 may also be referred to as a drift isolation region in this disclosure. The drift or internal isolation region may be a STI region similar to the device isolation region. For example, the drift isolation region 185 includes an isolation trench lined with an oxide liner 187 and is filled with silicon oxide. Other suitable types of isolation regions may also be useful for the drift isolation region. The drift isolation region is disposed in the substrate on the second side of the gate. The drift isolation region may extend or traverse along a width of the device region. For example, the drift isolation region 185 extends the width of the device region and connects or abuts the device isolation region 180. This leaves a device region surrounded by the drift and device isolation regions. This part of the device region serves to accommodate the second S/D or drain region 142 of the transistor. The second S/D region may include a LDD region. However, due to the drift isolation region, the LDD region is prevented from extending under the gate.

In one embodiment, the second side of the gate overlaps the drift isolation region. For example, a portion of the drift isolation region extends under the gate and underlaps the second side of the gate. The drift isolation region 185 which underlaps the gate protects the edge of the gate dielectric from high electric field during operation. The drift isolation region 185 displaces the second S/D region 142 away from the second side of the gate. The displacement, for example, should be sufficient to achieve the desired gate break down voltage of the gate dielectric.

In one embodiment, the drift or internal isolation region 185 which isolates the drain from the second side of the gate is shallower than the device isolation region 180. The bottom of the drift isolation region should leave sufficient amount of device region to accommodate a drift well 126. For example, the drift isolation region may be about 200~1000 Å deep with reference to the top surface of the surface substrate 108, leaving sufficient space for the drift well. Other suitable depths for the drift isolation region which provides sufficient space for the drift well may also be useful. The portion of the drift well beneath the drift isolation region forms a high resistance path to allow the drain terminal to be biased with high voltage. The depth of the internal isolation region may also depend on the thickness of the surface substrate, drain operation voltage and dose concentration of the drift well.

The drift well 126 is an intermediately doped first polarity type region. For example, the drift well is intermediately doped with the same polarity type dopants as the S/D regions. The dopant concentration of the drift well may be, for example, about 1E13~1E14/cm$^2$. Other suitable dopant concentrations for the drift well may also be useful. In one embodiment, the drift well is disposed in the device region, encompassing the drain region and the drift isolation region. The drift well 126, for example, extends under the gate 150, creating an overlap portion of the drift well. The drift well connects the drain region to the channel of the transistor. For example, the channel is along the gate from the source 141 to the edge of the drift well 126 under the gate 150. The overlap portion should be sufficiently wide to provide the desired on resistance and drive current. In one embodiment, the overlap portion is about 0.1-1 µm. Providing other widths for the overlap portion may also be useful.

The device 100, in one embodiment, includes a body contact region (not shown in FIG. 1) disposed in the surface substrate 108. The body contact region, for example, is a contact region for providing connection to the body of the transistor. The body contact region, for example, is a heavily doped region with second polarity type dopants for biasing the device well 112, such as a p-type well. The dopant concentration of the body contact region may be about the same as the dopant concentration of the S/D regions and the depth of the body contact region may be about the same as the depth of the S/D regions of the transistor. An internal isolation region (not shown) which traverses or extend in length along the channel length direction isolates the body contact region from the S/D regions. The internal isolation region (not shown) which traverses along the channel length direction includes the same depth as the internal isolation region 185 which traverses along the channel width direction. The body contact connects with the device well 112 which serve as body of the transistor by portion of the surface substrate beneath the internal isolation region 185 (not shown) as will be shown and described in FIGS. 2a-2d and FIGS. 3a-3d later.

Figure 2B:
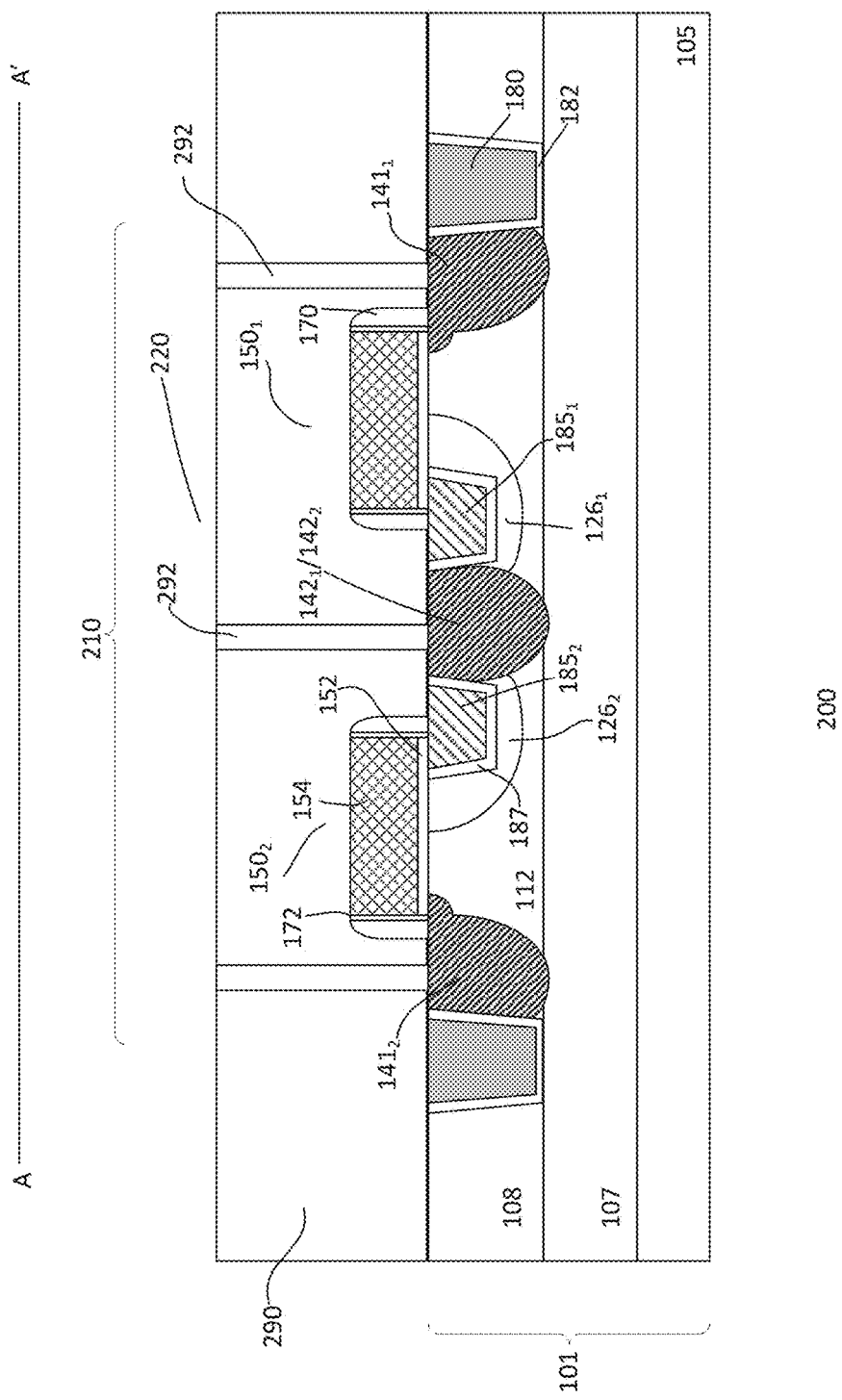
Figure 2C:
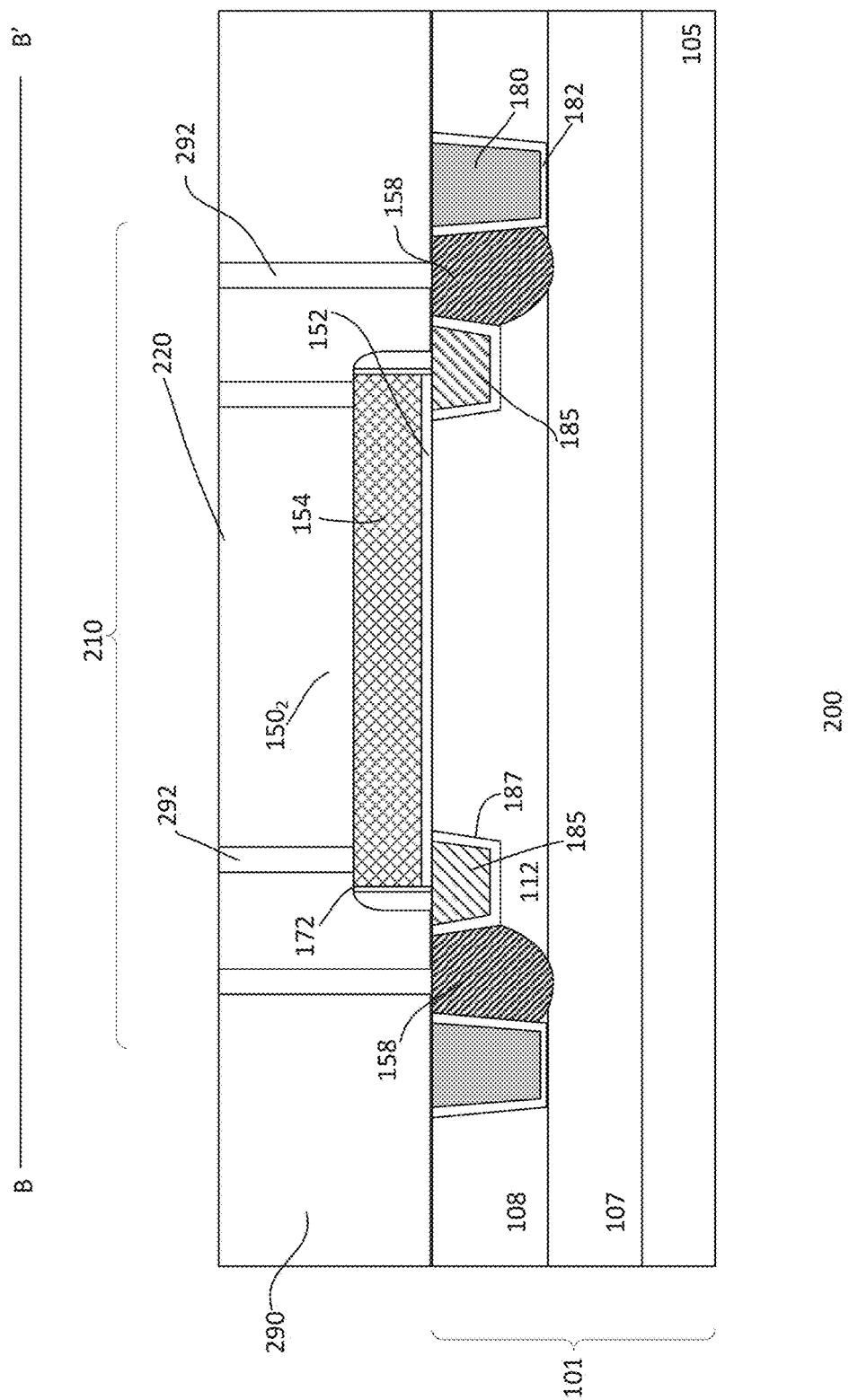

FIGS. 2a-2c show various views of an embodiment of a device 200. For instance, FIG. 2a shows a top view of the device, FIG. 2b shows a cross-sectional view taken along A-A' and FIG. 2c shows a cross-sectional view taken along B-B' of the device. The cross-sectional view taken along A-A' is along the channel length direction (or x-direction) while the cross-sectional view taken along B-B' is along the channel width direction (or y-direction) of the device. The device, for example, is an IC. Other types of devices may also be useful. The device 200 includes a multi-finger LDMOS transistor 220 disposed in a device region 210 of a substrate 101. The LDMOS transistor 220 is similar to the LDMOS transistor 110 as described in FIG. 1. Common elements may not be described or described in detail. In the interest of brevity, the description of the device 200 below primarily focuses on the difference(s) compared with the device 100 shown in FIG. 1.

The substrate, as shown, is a COI substrate with a buried insulator layer 107 disposed between a bulk substrate 105 and a surface substrate 108. In one embodiment, the COI substrate is a SOI substrate. Other types of COI substrates may also be useful.

Surrounding the device region is a device isolation region 180, such as a STI region. The device isolation region 180 extends from the surface substrate 108 to the insulator layer 107. The device also includes drift or internal isolation regions 185. The drift or internal isolation regions include a depth shallower than the depth of the device isolation region 180 and do not extend to the insulator layer 107. The internal isolation regions, in one embodiment, include internal isolation regions 185 that traverse or extend in length along the channel length direction (or x-direction) and internal isolation regions $185_1$ and $185_2$ that traverse or extend in length along the channel width direction (or y-direction). The internal isolation region which traverses along the channel width direction, for example, is used for drain isolation purpose while the internal isolation region which traverses along the channel length direction, for example, is used for body contact isolation purpose.

The multi-finger LDMOS transistor includes multiple gates or gate fingers. In one embodiment, the multi-finger LDMOS transistor is a dual-finger LDMOS transistor with first and second gates $150_1$-$150_2$. Providing a multi-finger LDMOS transistor with other number of fingers may also be useful.

A gate finger of the LDMOS transistor is similar to the single gate LDMOS transistor described in FIG. 1. The subscript refers to the finger of the LDMOS transistor. For example, a subscript 1 refers to elements of the first finger and a subscript 2 refers to elements of the second finger of the dual-finger LDMOS transistor. For example, a finger of the LDMOS transistor includes a gate 150 disposed between first and second S/D regions 141 and 142. The first S/D region 141 may be referred to as a source region while the second S/D region 142 may be referred to as a drain region. The fingers are configured such that the drain is a common drain region $142_1$/$142_2$. The drift regions or drift wells $126_1$ and $126_2$ of the two fingers, for example, may merge under the common drain. The drift regions encompass the drift isolation regions $185_1$ and $185_2$ which have shallower depth dimension than the device isolation region 180 and extend in length along the channel width direction (or y-direction) and adjacent to the drain region.

The fingers, as shown, are configured as mirror images with a common drain. The gates of the fingers may be a common gate when viewed from top. For example, the common gate may be rectangular shaped surrounding the drain. Other configurations of the fingers or gates may also be useful. For example, the gates may be separate gates. In some cases, the fingers may be configured to have a common source.

Referring to FIGS. 2a-2c, the dual-finger LDMOS transistor 220 includes first and second gates $150_1$-$150_2$, first and second source regions $141_1$-$141_2$, first and second drain regions $142_1$-$142_2$, drift isolation regions $185_1$-$185_2$, and first and second drift wells $126_1$-$126_2$. The first source region $141_1$ is disposed adjacent to a first side of the first gate $150_1$ and the second source region $141_2$ is disposed adjacent to a first side of the second gate $150_2$. The drift isolation region $185_1$ underlaps a portion of a second side of the first gate and the drift isolation region $185_2$ underlaps a portion of a second side of the second gate. The first drain region $142_1$ and the second drain region $142_2$ form a common or shared drain region for the dual-finger LDMOS transistor. The common drain region is displaced or isolated from the second sides of the first and second gates by the drift isolation regions $185_1$ and $185_2$ having shallower depth than the device isolation region and traverse along the channel width direction. The first drift well $126_1$ is disposed underneath encompassing the drift isolation region $185_1$ while the second drift well $126_2$ is disposed underneath encompassing the drift isolation region $185_2$. The first and second drift wells merge under the common drain region.

In one embodiment, the device 200 also includes first and second body contact regions 158 disposed on both sides of the first and second gates along the channel width direction as shown in FIGS. 2a and 2c. The first and second body contact regions 158 traverse or extend in length along the channel length direction (or x-direction), which is perpendicular to the source and drain regions $141_1$-$141_2$ and $142_1$/$142_2$. As shown, internal isolation regions 185 which traverse or extend in length along the channel length direction abut the body contact regions 158 and isolate the body contact regions from the source and drain regions. Portions of gate electrode which connects the first and second gates, for example, overlap the internal isolation regions 185 which extend in length along the channel length direction and abut the body contact regions. The body contact region 158 is heavily doped with second polarity type dopants for biasing the device well 112 which serves as body of the transistor. The body contact regions 158 are formed in the surface substrate and the internal isolation regions 185 having shallower depth allow the body contact regions to connect with the body of the transistor by portion of the surface substrate beneath the internal isolation regions 185.

Figure 2D:
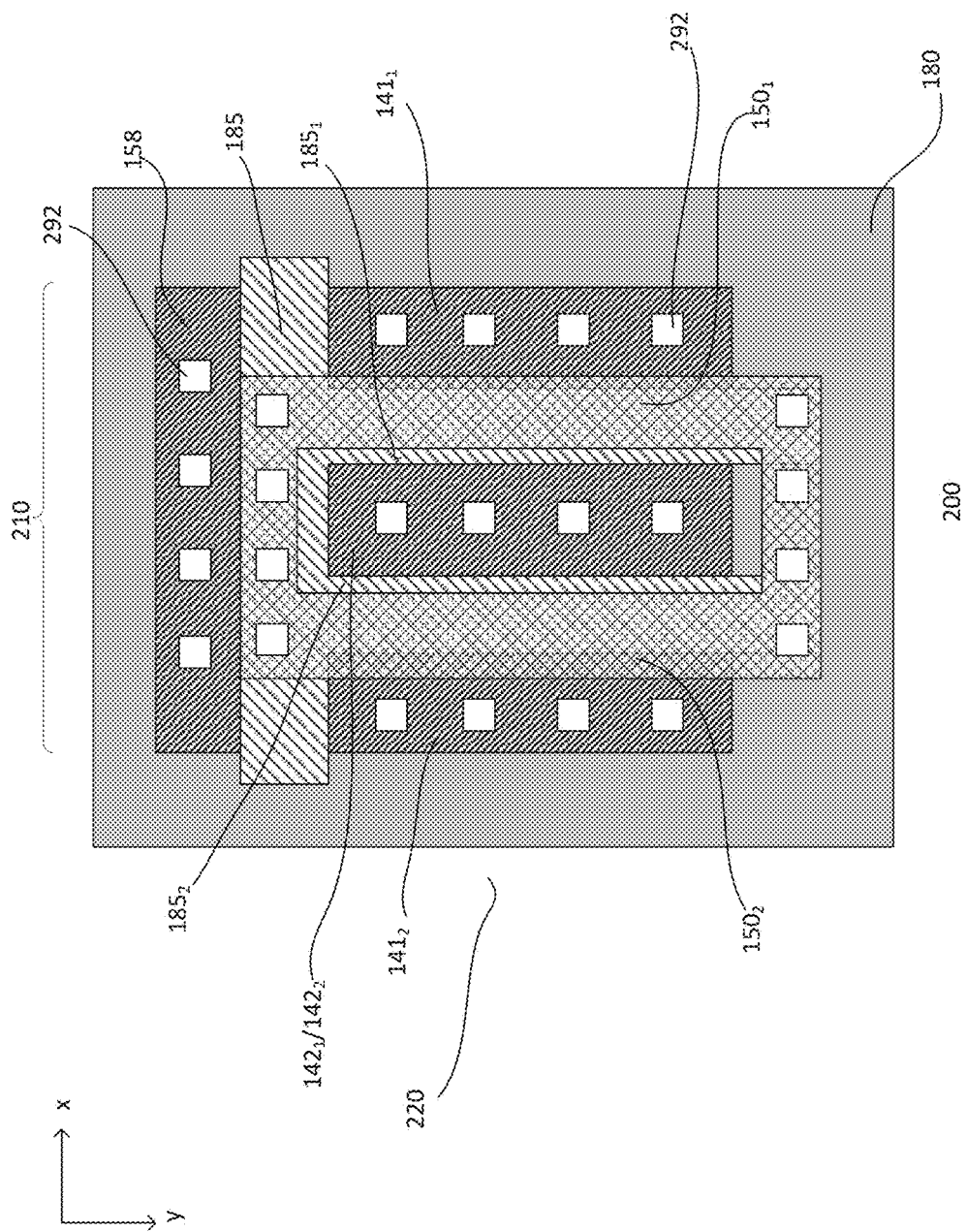
FIG. 2d shows a top view of an embodiment of a LDMOS device in a dual-finger implementation with a single body contact region.

In another embodiment, the device 200 includes a single body contact region 158 disposed on one side of the first and second gates along the channel width direction as shown in FIG. 2d. Such configuration is useful, for example, for devices with smaller active region. In such case, a first portion of the gate electrode which connects the first and second gates at the first side, for example, overlap the internal isolation region 185 which traverses along the channel length direction and abut the body contact region 158 when viewed from top. As for the second portion of the gate electrode which connects the first and second gates at the second side, it overlaps the device isolation region and drift or internal isolation regions $185_1$ and $185_2$ which traverse along the channel width direction and abut the common drain region $142_1$/$142_2$ when viewed from top.

Contacts or contact plugs 292 are coupled to various terminals of the transistor. The contacts, for example, are formed in a pre-metal dielectric (PMD) layer 290 of the device. The PMD layer is formed over the substrate, covering the transistor. The contacts, for example, are formed by damascene technique. Damascene technique includes forming contact vias in the PMD layer and filling them with conductive material. A planarizing process is performed to remove excess conductive material to form contacts. The contacts, for example, are tungsten contacts. Other types of contacts may also be useful. As shown, the contacts 292 are provided over the S/D regions, body contact regions, and gates. The contacts 292 provided over the gates, for example, are disposed over portions of gate electrode which overlap the internal isolation regions adjacent to the body contact regions and facilitate in biasing the gates. The contacts 292 coupled to the body contact regions 158, for example, facilitate in biasing the device well 112 which serve as body of the transistor.

Figure 3A:
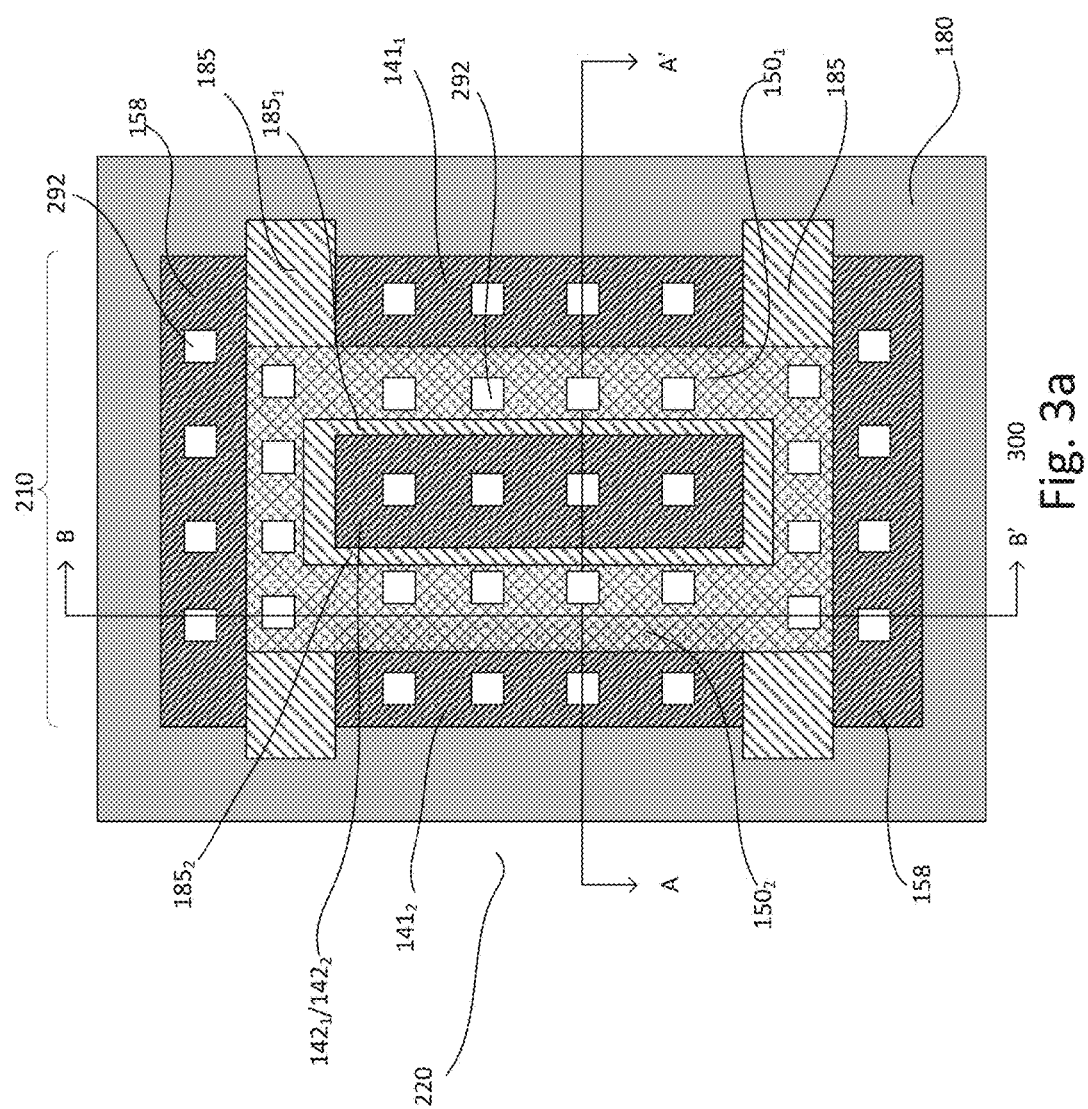
Figure 3B:
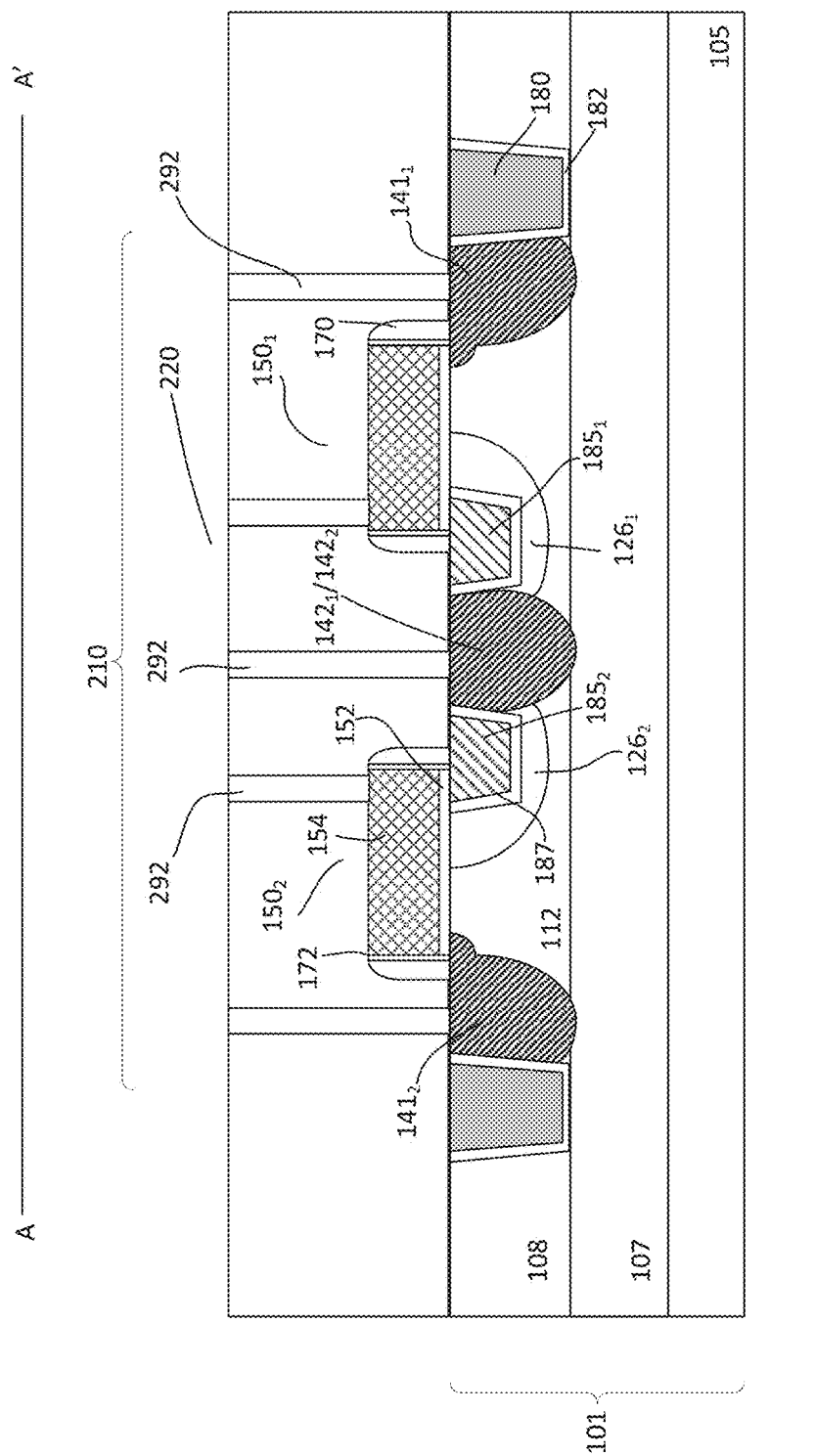

FIGS. 3a-3c show various views of another embodiment of a device 300. For instance, FIG. 3a shows a top view of the device, FIG. 3b shows a cross-sectional view taken along A-A' and FIG. 3c shows a cross-sectional view taken along B-B' of the device. The cross-sectional view taken along A-A' is along a channel length direction (or x-direction) while the cross-sectional view taken along B-B' is along the channel width direction (or y-direction) of the device. FIG. 3d shows a top view of another embodiment of the device 300 with a single body contact region. The device 300 is similar to the device 200 described and shown in FIGS. 2a-2d. Common elements and features having the same reference numerals may not be described or described in detail. In the interest of brevity, the description of the device 300 below primarily focuses on the difference(s) compared with the device 200 shown in FIGS. 2a-2d.

As shown, the device 300 includes a dual-finger LDMOS transistor 220. The LDMOS transistor is disposed in a device region 210. A device isolation region 180 surrounds the device region. The transistor includes first and second gates $150_1$ and $150_2$. The gates are connected, for example, forming a common gate. In one embodiment, the gate is a rectangular shaped gate surrounding the common drain $142_1/142_2$ of the gates or fingers. Internal isolation regions 185 and $185_1/185_2$ having shallower depth than the device isolation region are disposed in the device region. In one embodiment, the device 300 also includes first and second body contact regions 158 disposed on both sides of the first and second gates along the channel width direction as shown in FIGS. 3a and 3c. In another embodiment, the device 300 includes a single body contact region 158 disposed on one side of the first and second gates along the channel width direction as shown in FIG. 3d.

Referring to FIGS. 3a-3d, the device 300 differs from the device 200 in that gate contacts or gate contact plugs 292 are also disposed over the areas of the gate electrodes which overlay the internal isolation regions $185_1$ and $185_2$ adjacent to the drain region. This reduces the gate electrode current route. The shorter route reduces non-necessary voltage drop, reduces gate resistance, and improves radio frequency (RF) performance, such as the maximum functional frequency (Fmax) performance of the device.

Figure 4B:
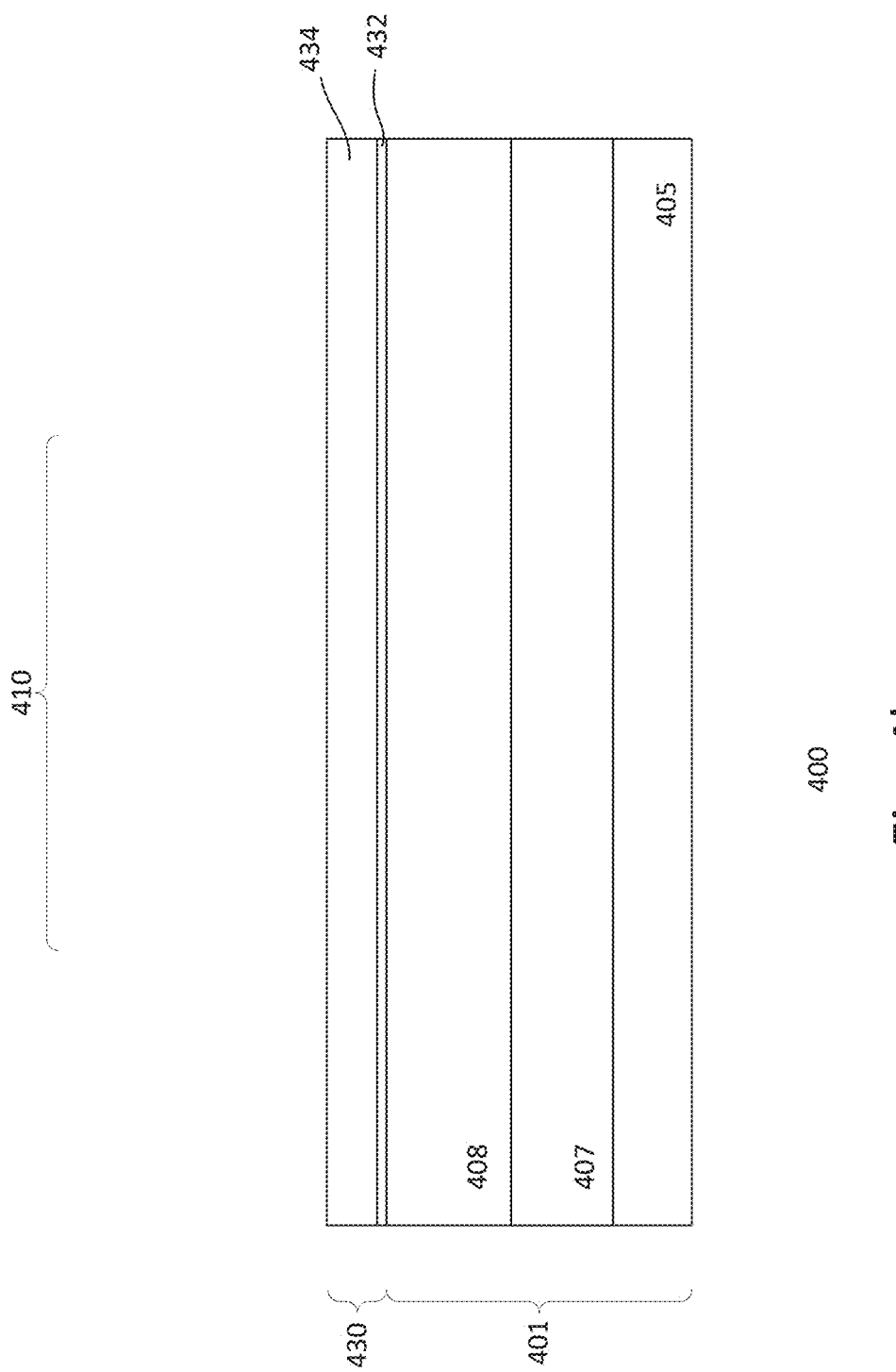
FIGS. 4a-4s show cross-sectional views of an embodiment of a process of forming a high voltage LDMOS device in a SOI wafer.
Figure 4C:
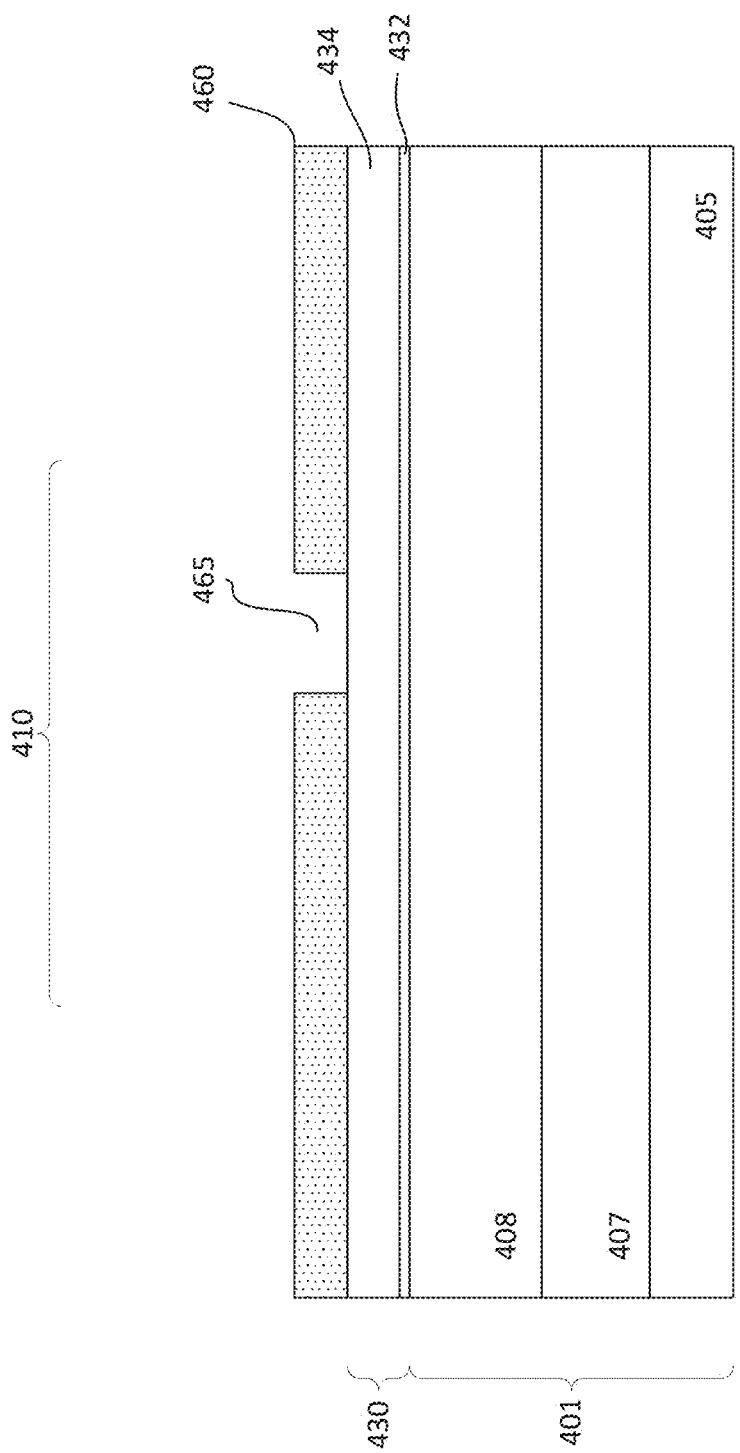
Figure 4D:
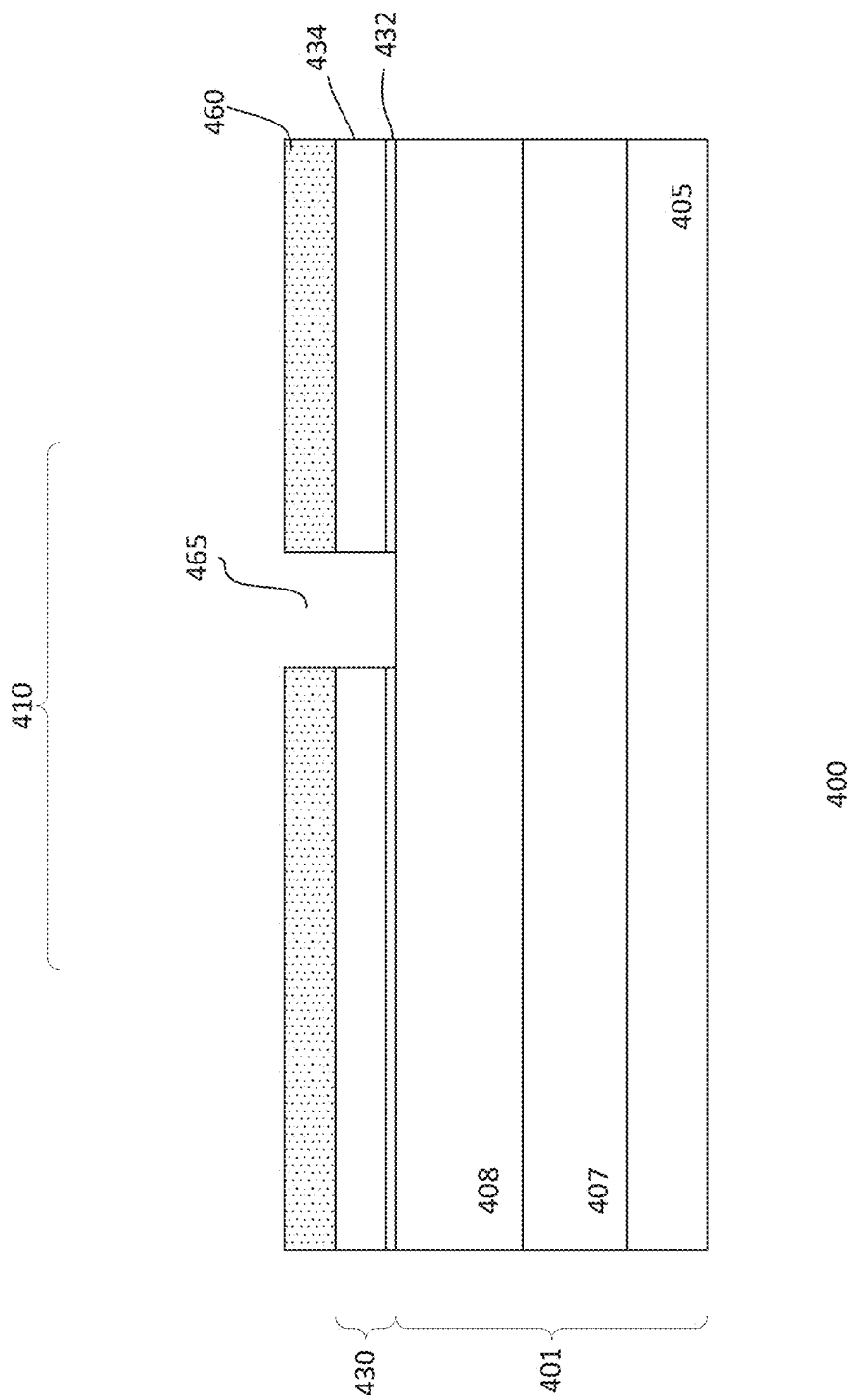
Figure 4E:
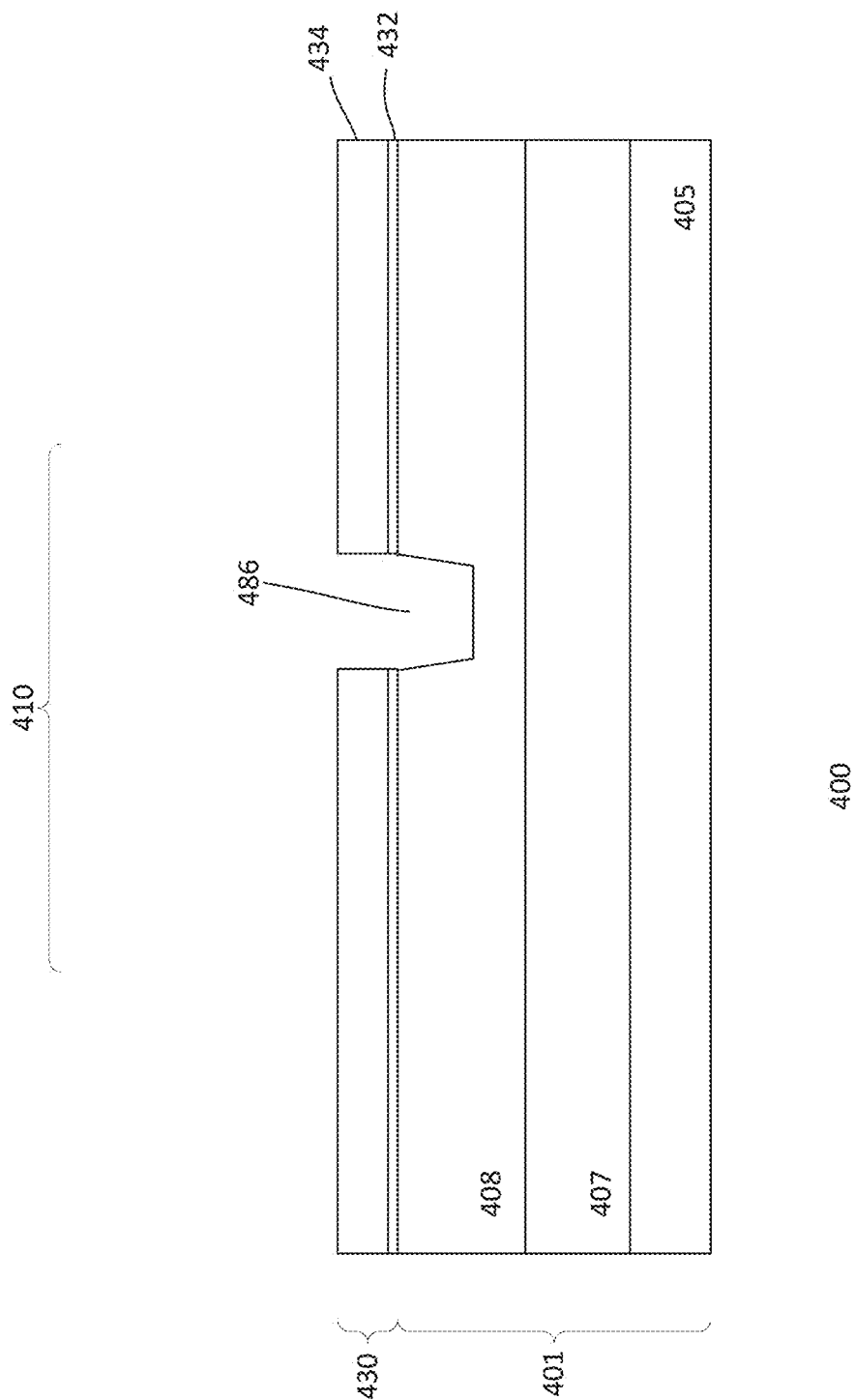
Figure 4G:
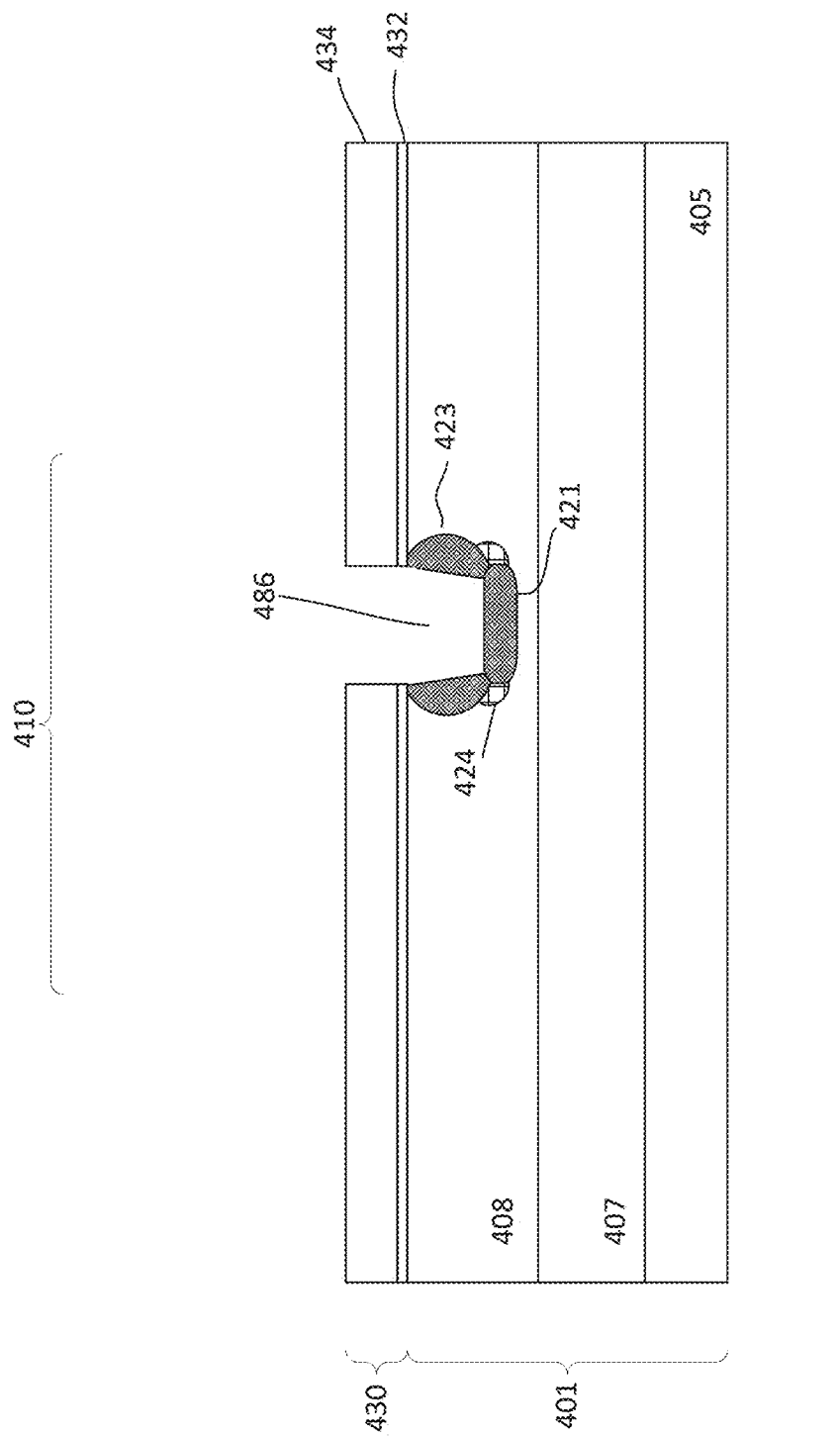
Figure 4H:
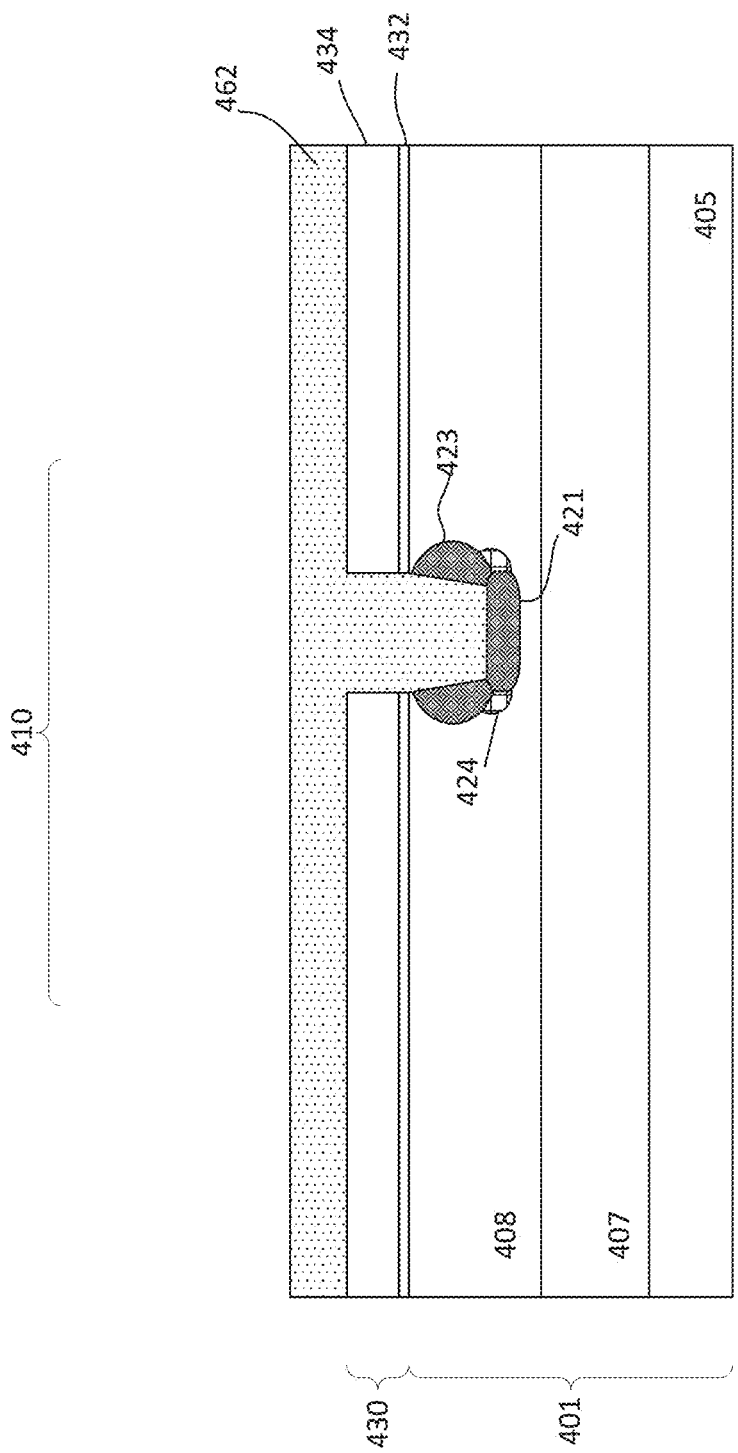
Figure 4I:
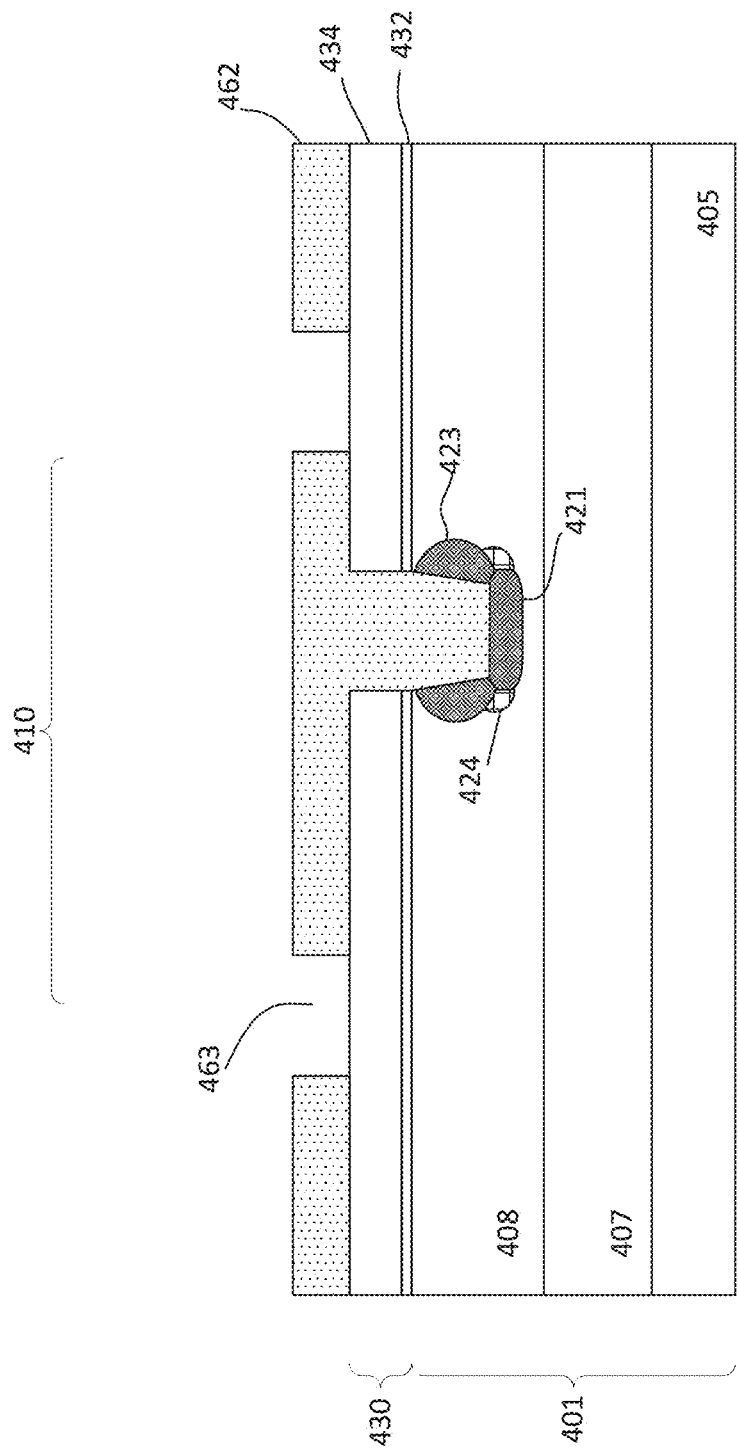
Figure 4K:
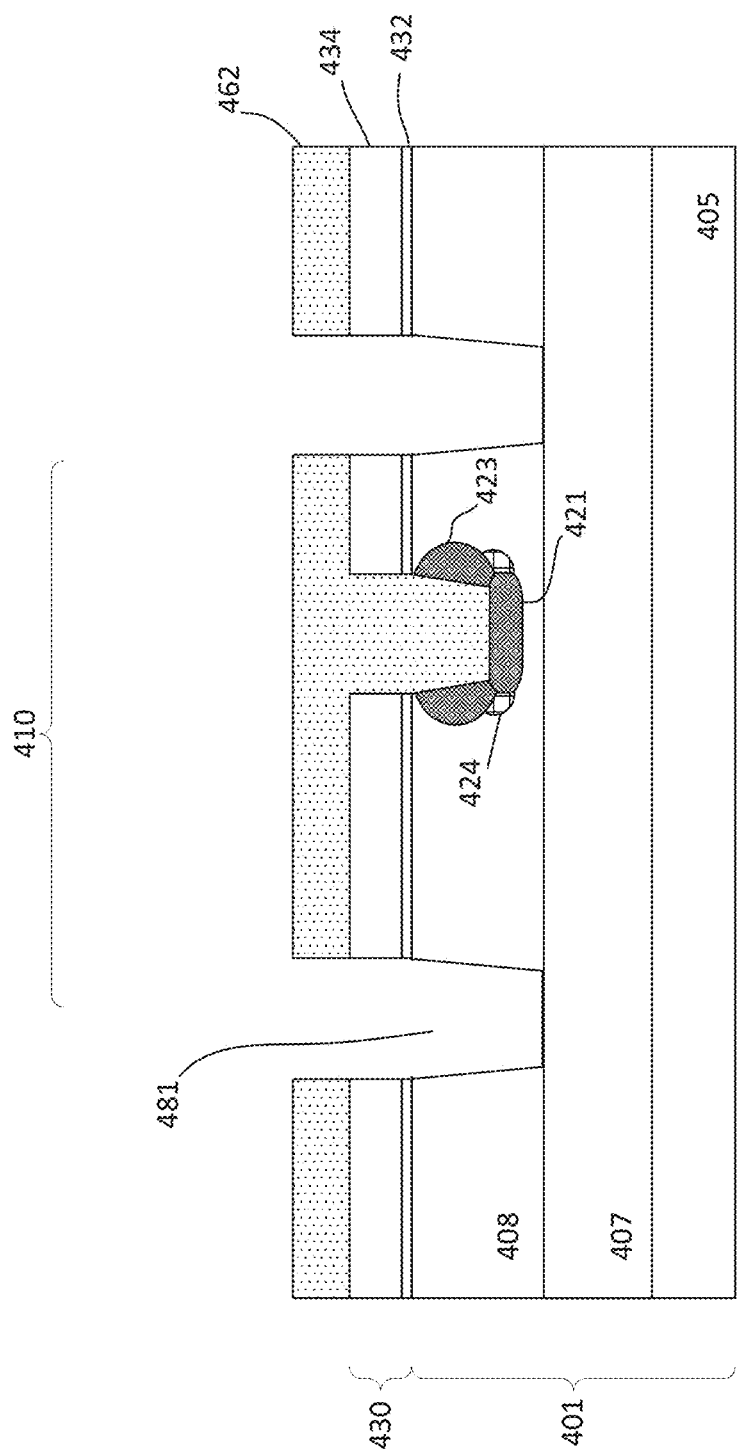
Figure 41:
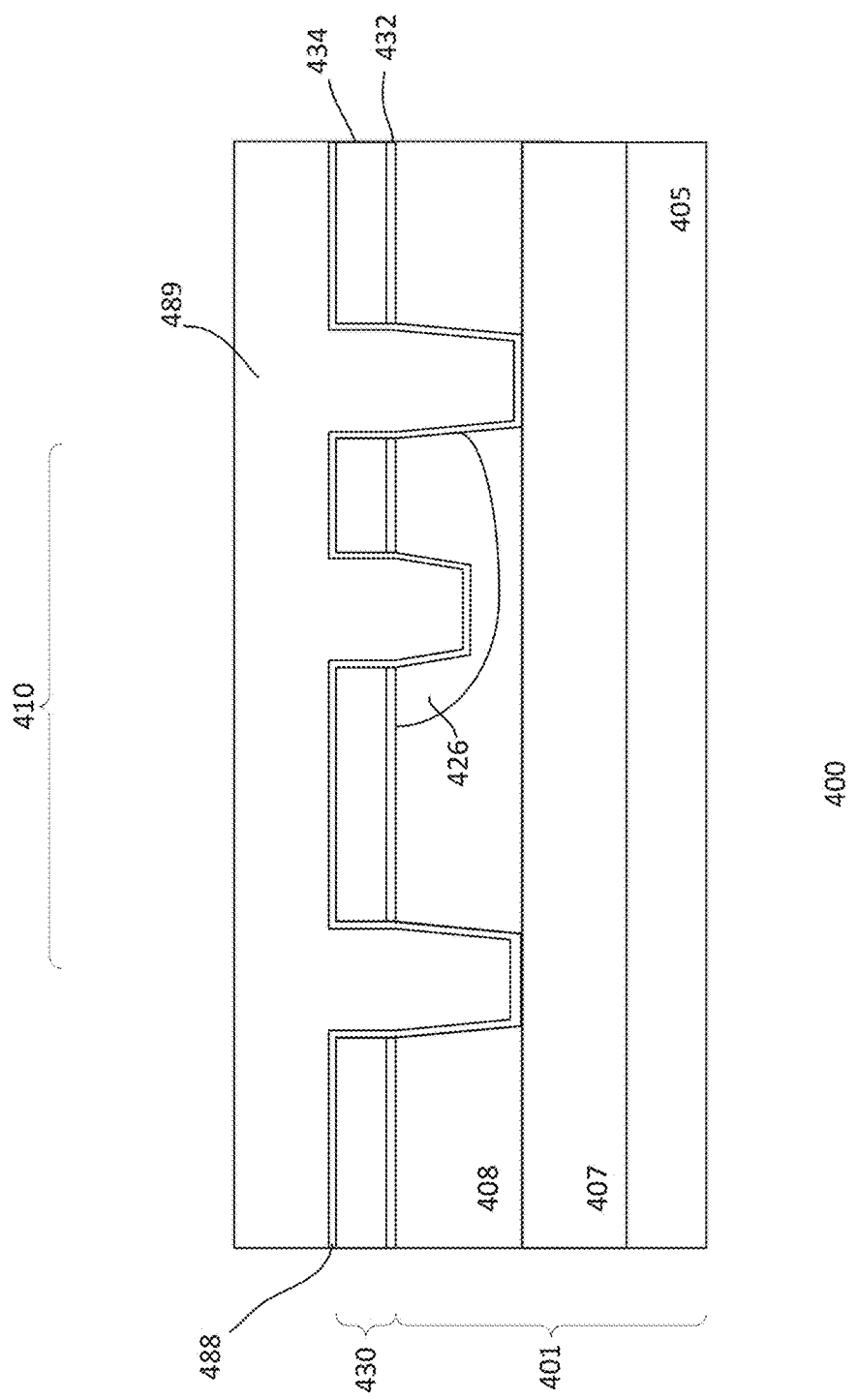
Figure 4M:
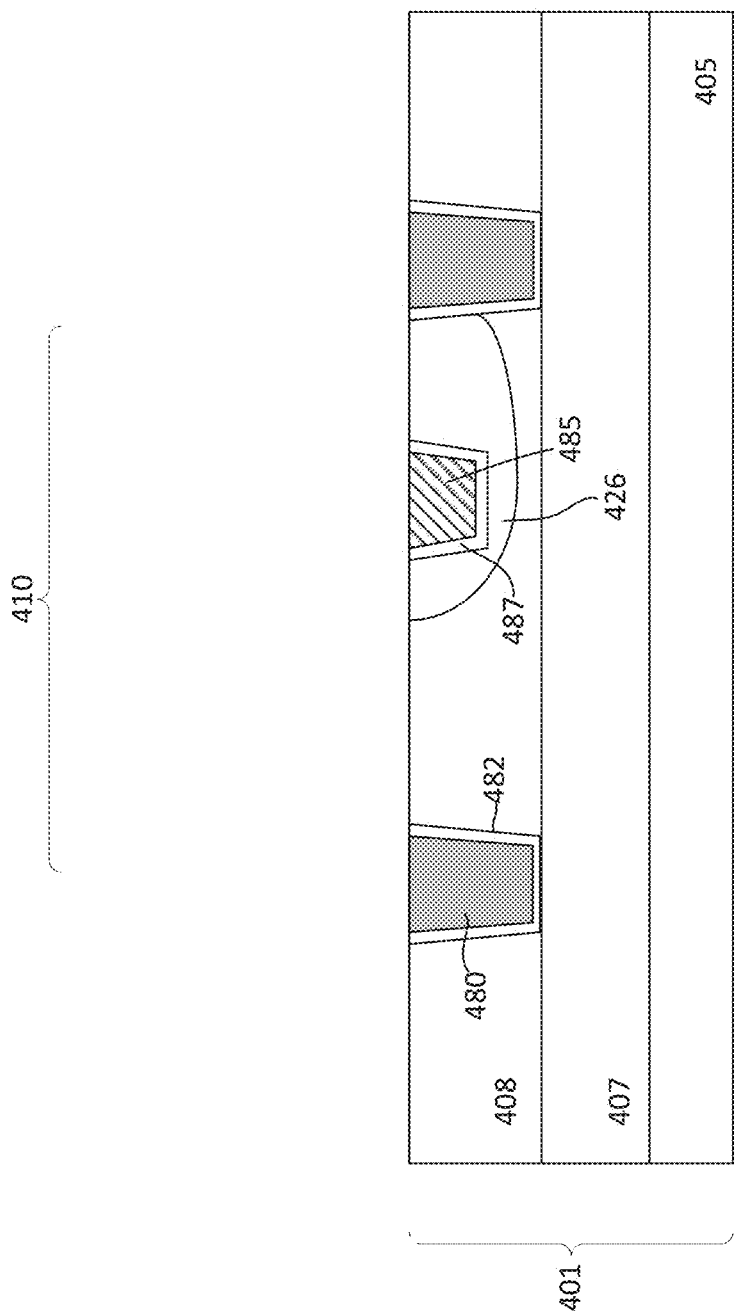
Figure 4N:
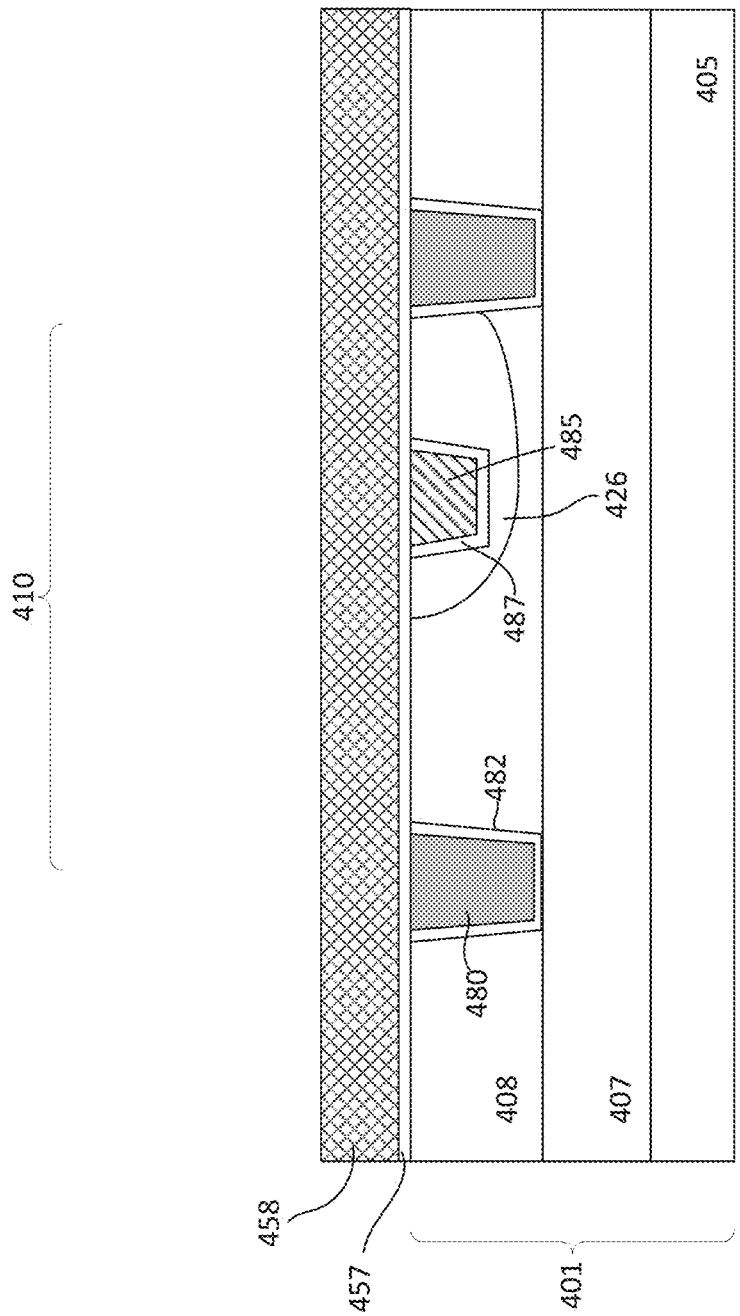
Figure 4O:
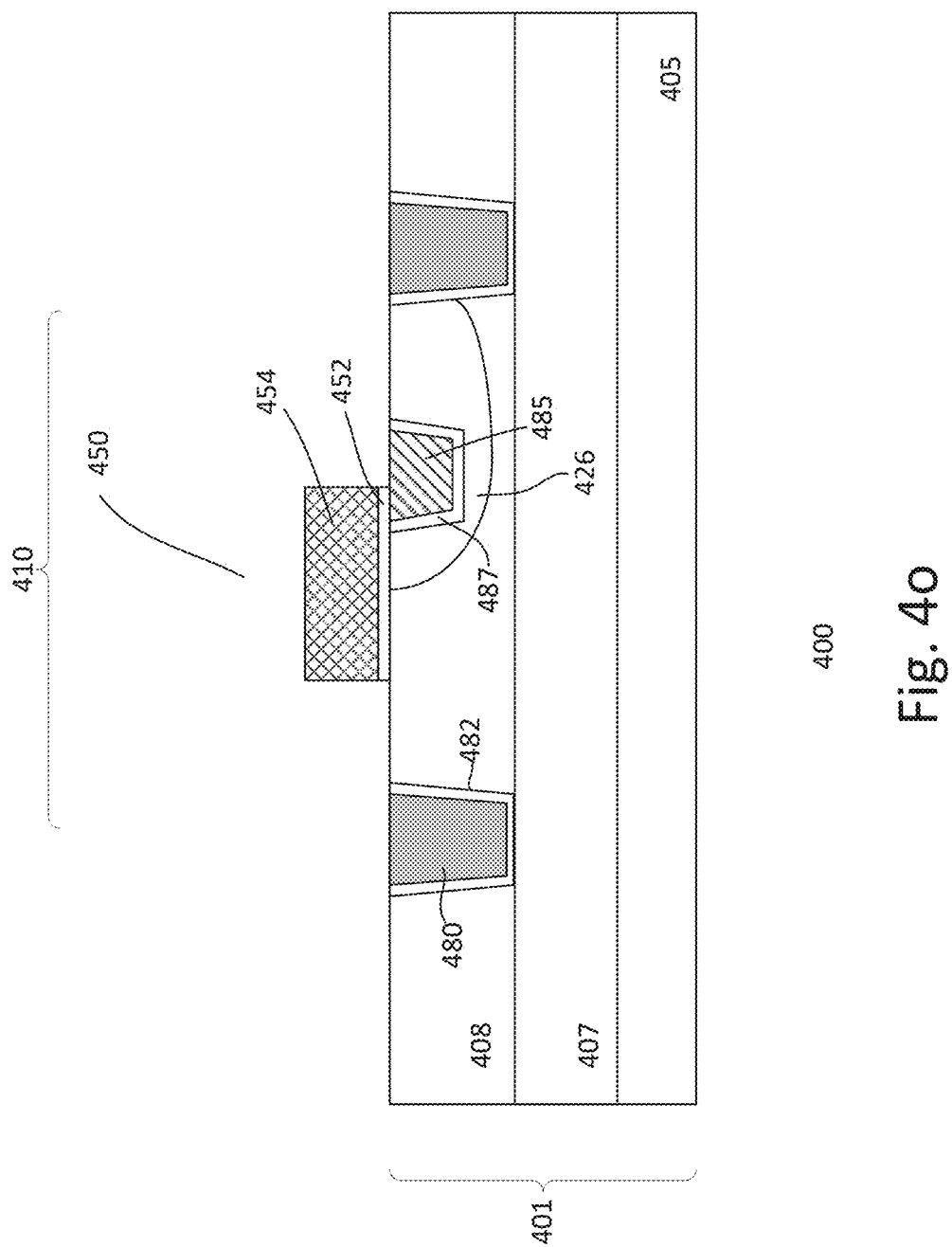
Figure 4Q:
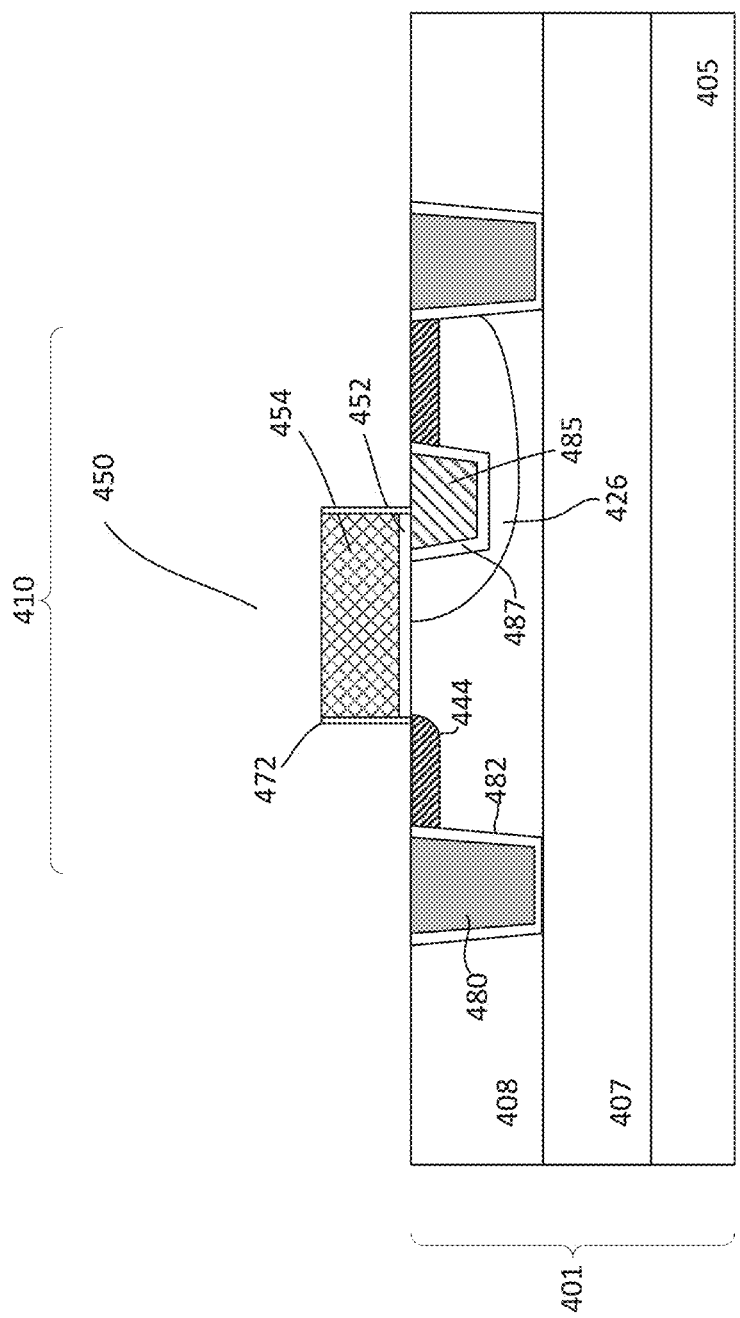
Figure 4R:
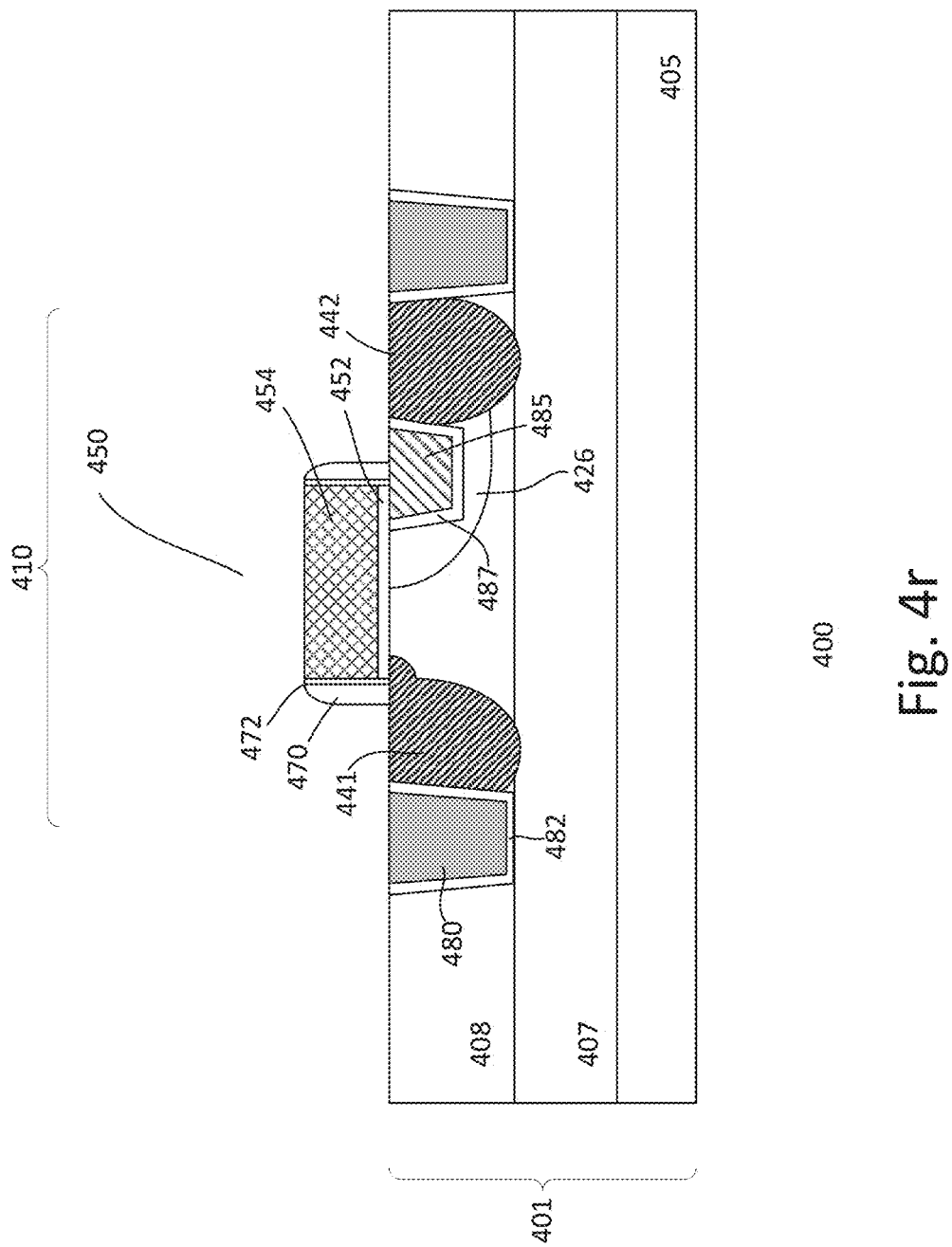
Figure 4S:
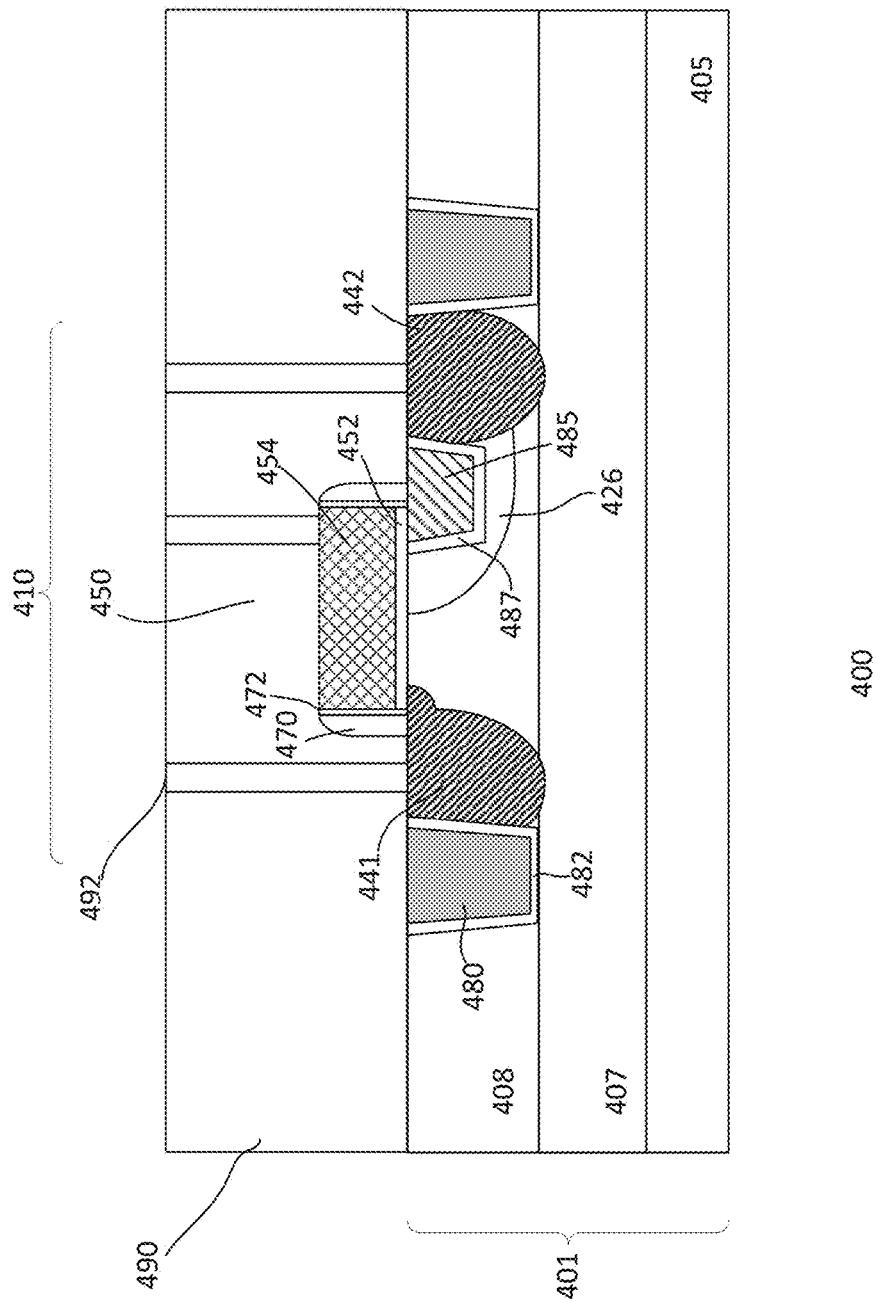

FIGS. 4a-4s illustrate cross-sectional views of an exemplary process flow of making a device 400. The cross-sectional views of FIGS. 4a-4s are taken along the channel length direction of the device. The device is similar to that described in FIGS. 1, 2a-2d and 3a-3d. Common elements may not be described or described in detail. Referring to FIG. 4a, a substrate 401 is provided. In one embodiment, the substrate is a COI substrate with a buried insulator layer 407 disposed between a bulk substrate 405 and a surface substrate 408. In one embodiment, the COI substrate is a SOI substrate. For example, the bulk and surface substrates are silicon. Other types of COI substrates may also be useful. It is understood that the bulk and surface substrates need not be formed of the same material.

The substrate may include a device region 410. The device region, for example, is for a LDMOS transistor. The substrate may also include regions for other types of transistors or circuit components, depending on the type of device or IC. For example, the device may also include regions for both n-type and p-type transistors to form a complementary MOS (CMOS) device. The device may also include device regions for different voltage transistors, such high voltage (HV), intermediate voltage (IV) and low voltage (LV) transistors as well as other types of devices, such memory devices. Other configurations of device regions for the device may also be useful.

Referring to FIG. 4b, a hard mask layer 430 is formed on the substrate. The hard mask layer, in one embodiment, includes a pad oxide layer 432 and a pad nitride layer 434. Other types of hard mask layers may also be useful. The pad oxide and pad nitride may be formed by thermal oxidation. Forming the layers of the hard mask by other suitable techniques may also be useful. Other pad oxide deposition procedures are also helpful.

Referring to FIG. 4c, a mask layer 460 is formed on the hard mask layer 430. In one embodiment, the mask layer 460 is a soft mask layer, such as a photoresist layer. The mask layer may also include other suitable types of mask materials. To improve lithographic resolution, an anti-reflective coating (ARC) may be used below the photoresist layer. An exposure source may selectively expose the photoresist layer through a reticle containing the desired pattern. The photoresist is developed to transfer the pattern of the reticle to the soft mask. Developing the resist mask forms opening(s) 465 corresponding to drift or internal isolation regions of the LDMOS transistor. For example, developing the resist mask forms openings corresponding to internal isolation regions that traverse or extend in length along the channel length direction and internal isolation regions that traverse or extend in length along the channel width direction when viewed from top.

In FIG. 4d, the hard mask is patterned using the soft mask. For example, an anisotropic etch, such as reactive ion etch (ME) is performed. The etch removes portion of the hard mask exposed by the soft mask, exposing the substrate below. In one embodiment, the portions of the surface substrate corresponding to the drift or internal isolation regions are exposed. The soft mask may be removed after patterning the hard mask by, for example, ashing.

Referring to FIG. 4e, the substrate is processed to form drift or internal isolation trenches. Although one drift or internal isolation trench 486 is shown, it is understood that the substrate is processed to form drift isolation trenches to accommodate the drift or internal isolation regions having layout as shown and as described in FIGS. 2a-2d and 3a-3d. In one embodiment, forming the drift isolation trenches includes an anisotropic etch, such as ME. The drift isolation trench extends partially into the surface substrate. For example, the drift isolation trench has a depth of about 200~1000 Å with respect to the top surface of the surface substrate 408. The drift isolation trench should leave sufficient amount of the surface substrate to accommodate a drift region or drift well. In one embodiment, the drift isolation trench leaves a sufficient amount of the surface substrate to accommodate a drift well. The process as shown in FIGS. 4d and 4e, for example, can also be performed in a single RIE step, followed by removal of the soft mask by ashing and cleaning.

In one embodiment, the drift isolation trench 486 includes a non-vertical sidewall profile. The trench, for example, includes angled or tapered sidewalls. This can be achieved by tuning the etch chemistry or other suitable techniques. The tapered sidewalls may facilitate filling. Providing a drift isolation trench with a vertical or a non-slanted sidewall profile may also be useful.

In FIG. 4f, the process continues to form a drift region or drift well in the surface substrate 408. In one embodiment, a first implant is performed to form a first polarity type intermediately doped region 421 at the bottom of the drift isolation trench 486 which traverses along the channel width direction while drift isolation trench which traverses along the channel length direction (not shown) is protected from the first implant. For example, exposed portion of the surface substrate underlying the bottom of the drift isolation trench 486 is implanted with first polarity type dopants to form a bottom trench intermediately doped region under the bottom of the drift isolation trench. The first implant, for example, is a vertical or zero degree implant using the hard mask as an implant mask.

The process of forming the drift region continues in FIG. 4g. In one embodiment, a second implant is performed to form lightly doped first polarity type regions 423 on sidewalls of the drift isolation trench 486 which traverses along the channel width direction while drift isolation trench which traverses along the channel length direction (not shown) is protected from the second implant. For example, exposed portion of the surface substrate adjacent to sidewalls of the drift isolation trench 486 are lightly doped with first polarity type dopants to form side trench lightly doped regions. In one embodiment, a quad angle implant is performed to form the side trench lightly doped regions using the same hard mask as implant mask. The quad angle implant may be performed at an angle of about 30~45 degree. Other angles or types of implant may be performed to form the side trench doped regions.

An optional halo implant may also be performed to form halo regions 424 at the corners of the drift isolation trench 486. The halo implant implants second polarity type dopants at corners of the bottom of the drift isolation trench. The halo regions are located at about the corners of the drift isolation trench. The halo implant, for example, is a quad angle implant performed at an angle of about 30~45 degree. The halo implant may be used to suppress hot carrier phenomenon.

Referring to FIG. 4h, a soft mask layer 462 is formed on the substrate. The soft mask layer, for example, is a photoresist layer. To improve lithographic resolution, an ARC may be provided below the resist layer. The soft mask layer may be formed by, for example, spin on technique. As shown, the soft mask layer also fills the drift isolation trenches.

In FIG. 4i, the soft mask layer is patterned to form an opening 463. The opening corresponds to the device isolation region. Patterning the soft mask layer may include selectively exposing it with an exposure source using a reticle containing the desired pattern. After exposure, a development process is performed to transfer the pattern of the reticle to the soft mask. For example, developing the resist mask forms an opening 463 corresponding to a device isolation region which surrounds the device region of the LDMOS transistor.

In FIG. 4j, the hard mask 430 is patterned using the soft mask 462. For example, an anisotropic etch, such as RIE is performed. The etch removes portion of the hard mask exposed by the soft mask to form an opening 464, exposing portions of the substrate below. In one embodiment, the portions of the substrate corresponding to the device isolation region are exposed.

Referring to FIG. 4k, the substrate is processed to form a device isolation trench 481. In one embodiment, forming the device isolation trench includes an anisotropic etch, such as RIE. The device isolation trench, in one embodiment, extends to the insulator layer 407. As shown, the soft mask 462 protects the drift isolation trench 486 which traverses along the channel width direction and the drift isolation trench (not shown) which traverses along the channel length direction during formation of the device isolation trench. The soft mask may be removed after processing the substrate, for example, by ashing. The process as shown in FIGS. 4j and 4k, for example, can also be performed in a single RIE step, followed by removal of the soft mask layer by ashing and cleaning.

In one embodiment, the device isolation trench 481 includes a non-vertical sidewall profile. The trench, for example, includes angled or tapered sidewalls. This can be achieved by tuning the etch chemistry or other suitable techniques. The tapered sidewalls may facilitate filling. Providing a device isolation trench with a vertical or a non-slanted sidewall profile may also be useful.

Referring to FIG. 4l, the process continues to fill the trenches. In one embodiment, a trench liner 488 is formed lining the drift and device isolation trenches as well as the hard mask 430. The trench liner, in one embodiment, is a silicon oxide liner. In one embodiment, the liner 488 is formed by a high temperature process. The high temperature process advantageously diffuses and activates the drift dopants and halo dopants (if any) to form the drift well 426. Forming the trench liner 488 using other suitable types of processes may also be useful. A separate anneal may be performed to diffuse and activate the dopants in the drift well. As shown, the drift well is self-aligned to the active region.

After forming the liner, a dielectric fill layer 489 is formed. The dielectric fill layer fills the trenches. The dielectric fill layer may include a high aspect ratio process (HARP) layer. Other types of dielectric fill layers, such as high density plasma (HDP) silicon oxide, may also be useful. The dielectric fill layer may be formed by chemical vapor deposition (CVD) or other forming processes.

In FIG. 4m, the substrate is planarized. Planarizing the substrate removes excess trench fill and liner as well as the hard mask. In one embodiment, the planarizing process is a chemical mechanical polishing (CMP) process. The planarizing process provides a planar top surface between the trench fill and the substrate. This forms the drift or internal isolation regions 485 and device isolation region 480 having different depths. For example, the drift and internal isolation region 485 has a shallower depth than the device isolation region 480. The trench liner 487 lines the drift isolation trench while the trench liner 482 lines the device isolation trench.

As shown in FIG. 4n, gate layers of a gate are formed on the substrate. In one embodiment, the gate layers include a gate dielectric layer 457 on the substrate and a gate electrode layer 458 formed thereon. The gate dielectric layer, for example, is silicon oxide. The thickness of the gate dielectric layer may be about 40-500 Å. For example, the gate dielectric layer is a high voltage gate dielectric layer. The gate dielectric layer may be formed by thermal oxidation. For example, the dielectric layer is formed by wet oxidation followed by annealing the substrate in an oxidizing ambient. The temperature of the wet oxidation can be, for example, about 600-900° C. The annealing can be, for example, performed at a temperature of about 600-1000° C. Other suitable process parameters may also be useful.

The gate electrode layer can be formed as an amorphous or non-amorphous layer. The gate electrode layer may be formed by, for example, CVD. Other suitable techniques for forming the gate electrode layer may also be useful. The thickness of the gate electrode layer may be about 700-2000 Å. Other thickness may also be useful. In one embodiment, the gate electrode layer includes a polysilicon doped with first polarity type dopants. The concentration of dopants in the gate electrode layer, for example, may be about 1E15-1E17/cm$^2$. Various techniques may be employed to dope the gate electrode layer, for example, in-situ doping or ion implantation. The gate electrode layer, for example, is a conformal layer, following the profile of the gate dielectric layer.

In some embodiments, the gate dielectric and electrode layers may be other types of layers. For example, the gate dielectric layer may be a high k dielectric layer while the gate electrode layer may be a metal gate electrode layer. Other configurations of gate layers may also be useful. For example, the gate dielectric and/or gate electrode layers may have multiple layers. The layers can be formed by various techniques, such as thermal oxidation, CVD and sputtering.

The gate layers are patterned to form a gate 450 as shown in FIG. 4o. The gate includes a gate electrode 454 over a gate dielectric 452. An etch mask (not shown) may be employed to pattern the gate layers to form the gate. For example, a soft mask, such as a photoresist layer, may be used. An exposure source may selectively expose the photoresist layer through a reticle containing the desired pattern. After selectively exposing the photoresist layer, it is developed to form openings corresponding to locations when the gate layers are to be removed. To improve lithographic resolution, an ARC may be used below the photoresist layer. An anisotropic etch, such as RIE, is performed to remove portions of the gate layers unprotected by the patterned resist mask, forming the gate.

In FIG. 4p, dielectric liners 472 are formed on sidewalls of the gate. In one embodiment, the dielectric liners are formed by thermal oxidation. The thermal oxidation forms an oxide liner on top and sidewalls of the gate as well as the substrate.

As shown in FIG. 4q, an implant mask (not shown) is formed on the substrate. The implant mask, for example, is a photoresist mask. Other types of masks may also be useful. The mask is patterned to form an opening in the device region. For example, the mask exposes the S/D regions. An ion implantation is performed. First polarity type dopants are implanted into the substrate, forming the LDD regions 444 in the S/D regions. As an example, the depth of the LDD region, for example, may be about 400 Å with an implant dose of about $1E12$-$1E14/cm^2$. Other implant parameters may also be useful. For example, a tilt quad angle implant may also be employed to form the LDD region. The LDD region extends under the sidewall of the gate on the source side. The LDD region, for example, may extend under the gate by about 0.01 μm. Providing a LDD region which extends under the gate by other distances may also be useful. In other embodiments, the implant mask may only expose the first S/D region. Other configurations of implant mask may also be useful. The implant mask is removed after forming the LDD region by, for example, ashing.

Referring to FIG. 4r, dielectric sidewall spacers 470 are formed. The dielectric sidewall spacers may be silicon nitride spacers. For example, a nitride layer is formed on the substrate by, for example, CVD. The thickness of the dielectric layer may be, for example, about 500 Å. Other thicknesses for the dielectric layer may also be useful. The thickness, for example, may depend on the desired width of the spacers. An anisotropic etch, such as RIE, may be performed to remove horizontal portions of the dielectric layer, leaving spacers on the sidewalls of the gate. Other types of dielectric spacers may also be useful.

After forming the spacers, first and second S/D regions 441 and 442 are formed in the substrate. An implant mask (not shown) may be provided. The implant mask exposes the device region. For example, the implant mask exposes the substrate where the first and second S/D regions are formed. The implant mask may be patterned using the same reticle as that used to form the implant mask for the LDD regions. First polarity type dopants are implanted into the substrate, forming heavily doped S/D regions. As an example, the depth of the S/D regions, for example, may be about 1600 Å using an implant dose of about $1E14$-$1E16/cm^2$ to form the S/D regions. Other suitable implant parameters may also be useful.

One or more body contact regions (not shown) may also be formed in the surface substrate adjacent to internal isolation region (not shown) which traverses along the channel length direction and separates the body contact region from the S/D regions. The body contact region, for example, is a heavily doped second polarity type region. The body contact region, for example, is the same polarity type as the device well which serves as body of the transistor. An implant mask may be provided for the implant to form the body contact region which traverses or extends in length along the channel length direction. The implant mask may be the same mask as that used to form second polarity type S/D regions in other device regions.

In FIG. 4s, a pre-metal dielectric (PMD) layer 490 is formed on the substrate. As shown, contact plugs 492 are provided in the PMD layer to the gate electrode 454, source 441, drain 442 and body contact region (not shown). The contact plugs, for example, may be tungsten contact plugs. Other types of conductive contact plugs may also be useful. Silicide contacts (not shown) may also be formed over contact regions of the transistor. The silicide contacts (not shown), for example, may be nickel-based silicide contacts. Other types of metal silicide contacts may also be useful. For example, the metal silicide contact may be cobalt silicide (CoSi). The silicide contacts may be about 50-300 Å thick. Other thicknesses of silicide contacts may also be useful. The silicide contacts may be employed to reduce contact resistance and facilitate contact to the back-end-of-line metal interconnects.

After the contact plugs are formed, inter metal dielectric (IMD) layer (not shown) is formed over the PMD layer. Damascene trenches are formed in the IMD layer using mask and etch processes. The trenches correspond to conductive lines which are in communication with contact plugs in the PMD layer. The trenches are filled with a conductive material, such as copper or copper alloy. Other types of conductive materials may also be useful. Excess conductive materials are removed by, for example, CMP to provide a planar top surface with exposed interconnect lines. Other techniques for forming the conductive lines and plugs as well as the use of other types of conductive materials may also be useful. For example, aluminum or aluminum alloy with RIE technique may also be used to form aluminum type interconnection or conductive lines.

The process continues to complete forming the device. For example, additional processes may be performed to complete the device. Such processes may include forming additional interconnect metal levels, final passivation, dicing, packaging and testing.

As described in FIGS. 4a-4s, the LD transistor is a single finger LD transistor. The patterns of the reticles used in forming the single finger LD transistor may be easily modified to form multi-finger LD transistors as shown and as described in FIGS. 2a-2d and FIGS. 3a-3d. Furthermore, the reticles may include forming other devices of the IC.

The embodiments as described result in advantages. For example, the process as described in FIGS. 4a-4s is a simplified process to form high voltage LDMOS device in SOI substrate having both shallow STI (drift or internal isolation region) and deep STI (device isolation region) regions without extra mask. This technique can be implemented in a CMOS manufacturing process using SOI substrate without expensive modification. Thus, this process is low cost and highly compatible with CMOS/SOI process. This technique has the additional advantage of using the drift or isolation regions having shallower depth to isolate the drain from the gate and to isolate the body contact region from the source/drain regions. The drift or internal isolation region having shallower depth adjacent to the body contact region allows the body contact region to connect with the body of the transistor in SOI substrate and to eliminate floating body effect. Furthermore, the use of the same hard mask and drift isolation trench having shallower depth as the implant mask for a self-aligned drift region implant gives more ideal diffusion region for a high breakdown voltage and low drain-source-on-resistance (Rdson) LDMOS device. As the drift region or drift well is self-aligned, this prevents implant overlay shift of the traditional well mask used in the implant process which impacts the LDMOS channel length. Furthermore, the self-aligned LDMOS in SOI substrate as presented in this disclosure can make use of the drift or internal isolation region for the gate contact landing on the gate electrode of the gate. This feature reduces gate resistance and improves RF performance of the device.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method of forming a device comprising:
providing a crystalline-on-insulator substrate having a bulk substrate and a surface substrate separated by a buried insulator layer, the surface substrate is defined with a device region;
forming a hard mask layer on the surface substrate;
patterning the hard mask layer to form at least a first hard mask opening;
forming a first drift isolation trench in the surface substrate using the patterned hard mask with the first hard mask opening, wherein the first drift isolation trench traverses along a channel width direction and comprises a first depth which extends partially through the surface substrate;
after forming the first drift isolation trench, implanting dopants into portion of the surface substrate adjacent to sidewalls and bottom of the first drift isolation trench using the hard mask layer and the first drift isolation trench as an implant mask, wherein the dopants comprises first polarity type dopants;
diffusing and activating the dopants in the portion of the surface substrate adjacent to the sidewalls and the bottom of the first drift isolation trench to form a self-aligned drift well using a high temperature process, wherein the drift well is self-aligned to the first isolation trench;
patterning the same hard mask layer to form a second hard mask opening;
forming a device isolation trench surrounding the device region in the surface substrate using the patterned hard mask with the second hard mask opening, wherein the device isolation trench comprises a second depth which extends to a bottom of the surface substrate;
filling the drift and device isolation trenches with isolation material to form a first drift isolation region and a device isolation region;
forming a transistor of a first polarity type having a gate in the device region; and
forming a first diffusion region adjacent to a first side of the gate and forming a second diffusion region adjacent to and displaced away from a second side of the gate.

2. The method of claim 1 wherein diffusing and activating the dopants comprises forming an isolation trench liner lining the drift and device isolation trenches.

3. The method of claim 1 wherein forming the self-aligned drift well comprises:
performing a first implant to form a first polarity type intermediately doped region at the bottom of the first drift isolation trench; and
performing a second implant to form lightly doped first polarity type regions on sidewalls of the first drift isolation trench.

4. The method of claim 3 wherein the first implant is a vertical implant and the second implant is a quad angle implant.

5. The method of claim 3 wherein forming the drift well comprises performing a halo implant to form halo regions having second polarity type dopants at corners of the first drift isolation trench.

6. The method of claim 1 comprising providing a soft mask over the hard mask and fills the first drift isolation trench prior to forming the device isolation trench, wherein the soft mask protects the first drift isolation trench during formation of the device isolation trench.

7. The method of claim 1 wherein the gate overlaps a portion of the first drift isolation region.

8. The method of claim 7 comprising forming a plurality of contact plugs, wherein the contact plugs are coupled to the gate and first and second diffusion regions of the transistor and wherein the contact plug coupled to the gate is formed over area of the gate which overlaps the first drift isolation region to reduce parasitic resistance on gate and to improve radio frequency (RF) performance.

9. The method of claim 1 wherein forming at least the first drift isolation trench in the surface substrate comprising:
forming a second drift isolation trench in the surface substrate, wherein the second drift isolation trench traverses along a channel length direction and comprises the first depth which extends partially through the surface substrate; and comprising
forming a body contact region having second polarity type dopants, wherein the body contact region is formed on the surface substrate and abuts the second drift isolation region, and the body contact region connects with a device well by portion of the surface substrate beneath the second drift isolation region.

10. The method of claim 9 wherein the first drift isolation region isolates the second diffusion region from the second side of the gate and the second drift isolation region isolates the body contact region from the first and second diffusion regions in the surface substrate.

11. A method for forming a device comprising:
providing a crystalline-on-insulator substrate having a bulk substrate and a surface substrate separated by a buried insulator layer, the surface substrate is defined with a device region;
forming a transistor of a first polarity type having a gate in the device region;

forming a first diffusion region adjacent to a first side of the gate and forming a second diffusion region adjacent to and displaced away from a second side of the gate;

forming a drift isolation region which traverses along a channel width direction in the surface substrate adjacent to and underlaps the second side of the gate;

after forming the drift isolation region, implanting dopants into portion of the surface substrate adjacent to sidewalls and bottom of the drift isolation region, wherein the dopants comprises first polarity type dopants;

diffusing and activating the dopants in the portion of the surface substrate adjacent to the sidewalls and the bottom of the drift isolation region to form a self-aligned drift well, wherein the drift well encompasses the drift isolation region; and forming a device isolation region surrounding the device region in the surface substrate, wherein the device isolation region comprises a second depth which is deeper than a first depth of the drift isolation region.

12. The method of claim 11 wherein the drift isolation region which comprises the first depth extends partially through the surface substrate and terminates a distance away from a bottom of the surface substrate, and the device isolation region which comprises the second depth extends to the bottom of the surface substrate.

13. The method of claim 11 wherein forming at least the drift isolation region and forming the device isolation region comprise:

forming a hard mask layer on the surface substrate;

patterning the hard mask layer to form at least a first hard mask opening;

forming a drift isolation trench in the surface substrate using the patterned hard mask with the first hard mask opening;

patterning the same hard mask layer to form a second hard mask opening; and forming a device isolation trench surrounding the device region in the surface substrate using the patterned hard mask with the second hard mask opening.

14. The method of claim 13 comprising providing a soft mask over the hard mask and fills the drift isolation trench prior to forming the device isolation trench, wherein the soft mask protects the drift isolation trench during formation of the device isolation trench.

15. The method of claim 11 implanting first polarity type dopants into portion of the surface substrate comprises using the hard mask and the drift isolation trench as an implant mask.

16. The method of claim 15 comprising forming a trench liner lining the drift and device isolation trenches using a high temperature process, wherein the high temperature process diffuses and activates the dopants to form the drift well which is self-aligned to the device region and under the drift isolation region.

17. A method of forming a device comprising:

providing a crystalline-on-insulator substrate having a bulk substrate and a surface substrate separated by a buried insulator layer, the surface substrate is defined with a device region;

forming a transistor of a first polarity type having a gate disposed in the device region;

forming a first diffusion region disposed adjacent to a first side of the gate and a second diffusion region disposed adjacent to and displaced away from a second side of the gate;

forming a drift isolation region which traverses along a channel width direction and disposed in the surface substrate adjacent to and underlaps the second side of the gate;

implanting first polarity type dopants into portion of the surface substrate adjacent to sidewalls and bottom of the drift isolation region;

diffusing and activating the dopants in the portion of the surface substrate adjacent to the sidewalls and the bottom of the drift isolation region to form a self-aligned drift well using a high temperature process, wherein the drift well encompasses the drift isolation region; and forming a device isolation region surrounding the device region in the surface substrate, wherein the device isolation region comprises a second depth which is deeper than a first depth of the drift isolation region.

18. The method of claim 17 wherein the drift isolation region which comprises the first depth extends partially through the surface substrate and terminates a distance away from a bottom of the surface substrate, and the device isolation region which comprises the second depth extends to the bottom of the surface substrate.

19. The method of claim 17 wherein the gate overlaps a portion of the drift isolation region.

20. The method of claim 17 comprising a plurality of contact plugs coupled to the gate and first and second diffusion regions of the transistor, wherein the contact plug coupled to the gate is disposed over area of the gate which overlaps the drift isolation region to reduce parasitic resistance on gate and to improve radio frequency (RF) performance.

* * * * *